United States Patent
Nakabayashi et al.

(10) Patent No.: US 7,365,948 B2
(45) Date of Patent: Apr. 29, 2008

(54) EXCHANGE-COUPLED FILM, METHOD FOR MAKING EXCHANGE-COUPLED FILM, AND MAGNETIC SENSING ELEMENT INCLUDING EXCHANGE-COUPLED FILM

(75) Inventors: Ryou Nakabayashi, Niigata-ken (JP); Eiji Umetsu, Niigata-ken (JP); Naoya Hasegawa, Niigata-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 463 days.

(21) Appl. No.: 10/896,084

(22) Filed: Jul. 21, 2004

(65) Prior Publication Data
US 2005/0024793 A1 Feb. 3, 2005

(30) Foreign Application Priority Data
Jul. 29, 2003 (JP) .............................. 2003-202760

(51) Int. Cl.
- *G11B 5/33* (2006.01)
- *G11B 5/127* (2006.01)
- *H04R 31/00* (2006.01)

(52) U.S. Cl. .............. 360/324.1; 360/324; 360/324.11; 360/324.12; 29/603.01; 29/603.07

(58) Field of Classification Search ......... 360/324–327
See application file for complete search history.

(56) References Cited

U.S. PATENT DOCUMENTS

| | | | |
|---|---|---|---|
| 6,141,191 A * | 10/2000 | Lee et al. ................ 360/324.1 |
| 6,219,210 B1 | 4/2001 | Pinarbasi |
| 6,222,707 B1 * | 4/2001 | Huai et al. ............... 360/324.1 |
| 6,266,210 B1 * | 7/2001 | Shiroishi .................... 360/126 |
| 6,278,592 B1 | 8/2001 | Xue et al. |
| 6,338,899 B1 * | 1/2002 | Fukuzawa et al. ..... 360/324.12 |
| 6,490,140 B1 | 12/2002 | Mao et al. |
| 6,498,707 B1 | 12/2002 | Gao et al. |
| 6,501,626 B1 | 12/2002 | Gill |
| 6,728,079 B2 * | 4/2004 | Shimazawa ................. 360/320 |
| 6,806,804 B2 * | 10/2004 | Saito et al. ................. 336/200 |
| 6,969,895 B2 * | 11/2005 | Han et al. ................... 257/421 |
| 7,008,702 B2 * | 3/2006 | Fukuzawa et al. ....... 428/811.2 |

(Continued)

FOREIGN PATENT DOCUMENTS

JP 2003-31871 1/2001

(Continued)

*Primary Examiner*—Andrea Wellington
*Assistant Examiner*—Jason M. Garr
(74) *Attorney, Agent, or Firm*—Brinks Hofer Gilson & Lione

(57) ABSTRACT

An exchange-coupled film includes a seed layer, an antiferromagnetic layer, and a ferromagnetic layer. The seed layer is formed at a thickness that is larger than the critical thickness, and the thickness of the seed layer is then decreased by etching so as to be smaller than or equal to the critical thickness. Thereby, a crystalline phase which extends through the seed layer from the upper surface to the lower surface can be formed, and/or the average size, in a direction parallel to the layer surface, of the crystal grains in the seed layer can be set to be larger than the thickness of the seed layer. Consequently, a large exchange coupling magnetic field Hex can be generated between the antiferromagnetic layer and the ferromagnetic layer.

10 Claims, 21 Drawing Sheets

U.S. PATENT DOCUMENTS

| | | | |
|---|---|---|---|
| 7,067,863 B2 * | 6/2006 | Guo | 257/295 |
| 7,145,755 B2 * | 12/2006 | Freitag et al. | 360/324.11 |
| 7,173,796 B2 * | 2/2007 | Freitag et al. | 360/324.1 |
| 2001/0053053 A1 * | 12/2001 | Saito et al. | 360/324.11 |
| 2002/0008947 A1 * | 1/2002 | Hasegawa et al. | 360/324.11 |
| 2002/0021537 A1 * | 2/2002 | Hasegawa et al. | 360/324.11 |
| 2002/0048126 A1 * | 4/2002 | Shimazawa | 360/320 |
| 2002/0048690 A1 * | 4/2002 | Fukuzawa et al. | 428/692 |
| 2002/0159205 A1 * | 10/2002 | Kula et al. | 360/324.11 |
| 2002/0191356 A1 * | 12/2002 | Hasegawa et al. | 360/324.11 |
| 2003/0002228 A1 * | 1/2003 | Suwabe et al. | 360/324.1 |
| 2003/0030434 A1 | 2/2003 | Hasegawa et al. | |
| 2003/0111335 A1 | 6/2003 | Saito et al. | |
| 2003/0174446 A1 * | 9/2003 | Hasegawa | 360/319 |
| 2003/0231436 A1 * | 12/2003 | Nishiyama | 360/324.1 |
| 2004/0121185 A1 * | 6/2004 | Fukuzawa et al. | 428/692 |
| 2004/0228044 A1 * | 11/2004 | Hasegawa et al. | 360/324.1 |
| 2005/0045971 A1 * | 3/2005 | Guo | 257/411 |
| 2005/0068686 A1 * | 3/2005 | Freitag et al. | 360/324.1 |
| 2005/0068692 A1 * | 3/2005 | Freitag et al. | 360/324.11 |
| 2005/0153169 A1 * | 7/2005 | Watanabe et al. | 428/694 BM |
| 2005/0248980 A1 * | 11/2005 | Han et al. | 365/171 |
| 2007/0015293 A1 * | 1/2007 | Wang et al. | 438/3 |

FOREIGN PATENT DOCUMENTS

| | | | |
|---|---|---|---|
| JP | 2001-297913 | | 10/2001 |
| JP | 2001-297914 | | 10/2001 |
| JP | 2002-280641 | | 9/2002 |
| JP | 2003-016613 | * | 1/2003 |
| JP | 2003-31870 | | 1/2003 |
| JP | 2003-101102 | | 4/2003 |
| WO | 02-542617 | | 12/2002 |

* cited by examiner

EXCHANGE-COUPLED FILM, METHOD FOR MAKING EXCHANGE-COUPLED FILM, AND MAGNETIC SENSING ELEMENT INCLUDING EXCHANGE-COUPLED FILM

This application claims the benefit of priority to Japanese Patent Application No. 2003-202760, herein incorporated by reference.

BACKGROUND OF THE INVENTION

1. Field of the Invention

The present invention relates to an exchange-coupled film which includes a seed layer, an antiferromagnetic layer, and a ferromagnetic layer disposed in that order from the bottom and in which the magnetization direction of the ferromagnetic layer is pinned in a predetermined direction by an exchange coupling magnetic field generated at the interface between the antiferromagnetic layer and the ferromagnetic layer; a method for making the exchange-coupled film; and a magnetic sensing element including the exchange-coupled film. More particularly, the invention relates to an exchange-coupled film in which the total thickness and shunt loss can be decreased by decreasing the thickness of the seed layer thereof, a method for making the exchange-coupled film, and a magnetic sensing element including the exchange-coupled film.

2. Description of the Related Art

FIG. 27 is a partial sectional view of a conventional magnetic sensing element (spin-valve thin-film element), viewed from a surface facing a recording medium.

As shown in FIG. 27, an antiferromagnetic layer 50, a pinned magnetic layer 51, a nonmagnetic layer 52, a free magnetic layer 53, and a protective layer 47 are disposed in that order on a seed layer 44 which is, for example, composed of a NiFeCr alloy.

In such a spin-valve thin-film element, an exchange coupling magnetic field is generated at the interface between the antiferromagnetic layer 50 and the pinned magnetic layer 51 by annealing, and the magnetization of the pinned magnetic layer 51 is pinned in the height direction (in the Y direction in the drawing).

In the spin-valve thin-film element shown in FIG. 27, hard bias layers 5a are disposed at both sides of a laminate including the seed layer 44 to the protective layer 47, and the magnetization of the free magnetic layer 53 is aligned in the track width direction (in the X direction in the drawing) by a longitudinal bias magnetic field from the hard bias layers 5a.

As shown in FIG. 27, electrode layers 8a are disposed on the hard bias layers 5a. A sensing current from one of the electrode layers 8a mainly flows through three layers, i.e., the pinned magnetic layer 51, the nonmagnetic layer 52, and the free magnetic layer 53.

In the spin-valve thin-film element shown in FIG. 27, by providing the seed layer 44 under the antiferromagnetic layer 50, an improvement in current-carrying reliability, for example, electromigration resistance, and an improvement in the rate of change in resistance are expected.

It is believed to be important that the seed layer 44 has a face-centered cubic crystal structure (fcc structure) and the equivalent crystal plane represented as {111} plane is preferentially oriented parallel to the layer surface.

If the seed layer 44 has the fcc structure with the {111} orientation, the individual layers can be formed on the seed layer 44 properly so as to have the {111} orientations of fcc structures. It is also possible to increase the crystal grain sizes. Consequently, scattering of conduction electrons in the grain boundaries can be reduced, resulting in an improvement in electrical conduction. The magnitude of the exchange coupling magnetic field generated between the pinned magnetic layer 51 and the antiferromagnetic layer 50 can also be increased, resulting in an improvement in current-carrying reliability.

Conventionally, the seed layer 44 is composed of a NiFeCr alloy or NiCr alloy as disclosed in Japanese Unexamined Patent Application Publication No. 2003-101102.

Recently, there has been an increased demand for gap-narrowing and decreases in shunt loss in magnetic sensing elements, and further decreases in the thicknesses of the individual layers constituting magnetic sensing elements have been required.

The conventional seed layer has a thickness of about 50 Å. If the thickness of the seed layer is decreased so as to be smaller than the critical thickness, the magnitude of the exchange coupling magnetic field Hex between the antiferromagnetic layer and the ferromagnetic layer disposed on the seed layer is extremely decreased, resulting in a rapid degradation in the change in resistance ΔRs and the rate of change in resistance ΔRs/Rs.

Laminates having the structure descried below were formed for testing. Changes in the rate of change in resistance ΔRs/Rs, change in resistance ΔRs, sheet resistance Rs, and unidirectional exchange bias magnetic field Hex* with the thickness of the seed layer composed of $(Ni_{0.8}Fe_{0.2})_{60}Cr_{40}$ were investigated.

Substrate/Alumina/Seed layer [NiFeCr]/Antiferromagnetic layer [PtMn (140 Å)]/Pinned magnetic layer [CoFe (16 Å)/Ru (8.7 Å)/CoFe (22 Å)]/Nonmagnetic layer [Cu (21 Å)]/Free magnetic layer [CoFe (10 Å)/NiFe (35 Å)]/Protective layer [Ta (30 Å)]

The results thereof are shown in FIGS. 28 to 31. FIG. 28 is a graph showing the measurement results of the sheet resistance Rs; FIG. 29 is a graph showing the measurement results of the unidirectional exchange bias magnetic field Hex* of the pinned magnetic layer; FIG. 30 is a graph showing the measurement results of the rate of change in resistance ΔRs/Rs; and FIG. 31 is a graph showing the measurement results of the change in resistance ΔRs.

As shown in FIGS. 28 and 29, if the thickness of the seed layer becomes 38 Å or less, the sheet resistance Rs of the magnetic sensing element rapidly increases, and the unidirectional exchange bias magnetic field Hex* rapidly decreases. As shown in FIGS. 30 and 31, if the thickness of the seed layer becomes 38 Å or less, the rate of change in magnetoresistance ΔRs/Rs and the change in resistance ΔRs rapidly decrease.

The thickness of the seed layer at the critical point below which the unidirectional exchange bias magnetic field Hex*, change in resistance ΔRs, and rate of change in resistance ΔRs/Rs of the laminate constituting the magnetic sensing element rapidly decrease is referred to as a critical thickness of the seed layer.

As described above, because the seed layer has the critical thickness below which the change in resistance ΔRs and the rate of change in resistance ΔRs/Rs rapidly decrease, it has not been possible to form an exchange-coupled film in which the thickness of the seed layer is smaller than or equal to the critical thickness or a magnetic sensing element including such an exchange-coupled film.

SUMMARY OF THE INVENTION

The present invention has been achieved in order to overcome the problems described above. It is an object of the present invention to provide an exchange-coupled film in which even if the thickness of the seed layer is decreased so as to be smaller than the critical thickness, a strong exchange coupling magnetic field Hex can be generated between the antiferromagnetic layer and the ferromagnetic layer, and a method for making the exchange-coupled film. It is also an object of the present invention to provide a magnetic sensing element in which the total thickness and the shunt loss can be decreased by using the exchange-coupled film.

In one aspect of the present invention, an exchange-coupled film includes a seed layer, an antiferromagnetic layer, and a ferromagnetic layer disposed in that order from the bottom, the magnetization of the ferromagnetic layer being directed in a predetermined direction by an exchange coupling magnetic field generated at the interface between the antiferromagnetic layer and the ferromagnetic layer. The seed layer has a thickness that is smaller than or equal to the critical thickness, and the seed layer has a crystalline phase which extends through from the upper surface to the lower surface of the seed layer.

The present inventors have found that, with respect to an exchange-coupled film in which an antiferromagnetic layer and a ferromagnetic layer are disposed on a seed layer, when a strong exchange coupling magnetic field Hex is generated between the antiferromagnetic layer and the ferromagnetic layer, the seed layer has a crystalline phase including columnar grains which extend through from the upper surface to the lower surface of the seed layer.

However, if the seed layer of the exchange-coupled film is formed simply with a thickness that is smaller than the critical thickness, the size of the crystal grains formed in the seed layer becomes very small, and the crystalline phase including the columnar grains which extend through from the upper surface to the lower surface of the seed layer ceases to be present. Therefore, if the thickness of the seed layer of the conventional exchange-coupled film is set to be smaller than the critical thickness, the exchange coupling magnetic field Hex is rapidly decreased.

In contrast, in the present invention, by employing a method for making an exchange-coupled film which will be described below, it has become possible for the first time to provide the seed layer having a thickness that is smaller than or equal to the critical thickness and including a crystalline phase including an aggregate of columnar grains which extend through from the upper surface to the lower surface of the seed layer.

In another aspect of the present invention, an exchange-coupled film includes a seed layer, an antiferromagnetic layer, and a ferromagnetic layer disposed in that order from the bottom, the magnetization of the ferromagnetic layer being directed in a predetermined direction by an exchange coupling magnetic field generated at the interface between the antiferromagnetic layer and the ferromagnetic layer. The seed layer is a metal layer having a thickness that is smaller than or equal to the critical thickness and having a crystalline phase. The average crystal grain size, in a direction parallel to the layer surface, of the crystal grains in the seed layer is larger than the thickness of the seed layer.

In an exchange-coupled film in which an antiferromagnetic layer and a ferromagnetic layer are disposed on a seed layer, in order to generate a strong exchange coupling magnetic field Hex between the antiferromagnetic layer and the ferromagnetic layer, the size of the crystal grains in the seed layer must be large.

However, if the seed layer of the exchange-coupled film is formed simply with a thickness that is smaller than the critical thickness, the size of the crystal grains in the seed layer becomes extremely small, and the exchange coupling magnetic field Hex is rapidly decreased.

In contrast, in the present invention, by employing a method for forming an exchange-coupled film which will be described below, it has become possible for the first time to provide the seed layer in which even if the thickness is smaller than or equal to the critical thickness, the size of the crystal grains in the seed layer can be increased, and the average crystal grain size, in a direction parallel to the layer surface, of the seed layer is larger than the thickness of the seed layer In the present invention, preferably, the crystalline phase of the seed layer has a face-centered cubic (fcc) structure and the equivalent crystal plane represented as {111} plane is preferentially oriented parallel to the interface.

Preferably, the seed layer is composed of a NiCr alloy or a NiFeCr alloy.

In another aspect of the present invention, an exchange-coupled film includes a seed layer, an antiferromagnetic layer, and a ferromagnetic layer disposed in that order from the bottom, the magnetization of the ferromagnetic layer being directed in a predetermined direction by an exchange coupling magnetic field generated at the interface between the antiferromagnetic layer and the ferromagnetic layer. The seed layer is composed of a NiCr alloy or a NiFeCr alloy. The Cr content in the NiCr alloy or the NiFeCr alloy is 35 to 60 atomic percent, and the thickness of the seed layer is smaller than or equal to the critical thickness.

When the seed layer is composed of the NiCr alloy or the NiFeCr alloy, if the Cr content is increased, the crystal grain size in the in-plane direction of the crystal grains in the seed layer can be increased. Consequently, the crystal grain sizes in the in-plane direction of the ferromagnetic layer and other layers formed on the seed layer are also increased. As a result, the grain boundary densities in these layers are decreased, and it is possible to decrease the spin-independent scattering effect at the grain boundaries. The exchange coupling magnetic field Hex between the antiferromagnetic layer and the ferromagnetic layer can also be strengthened. If the Cr content is increased, the resistivity of the seed layer is increased, resulting in a reduction in shunt loss.

However, if the Cr content in the NiCr alloy or the NiFeCr alloy is increased, the critical thickness of the seed layer is increased. Therefore, in the conventional exchange-coupled film, there is no other choice but to increase the thickness of the seed layer. As a result, the rate of change in resistance ΔR/R is decreased because of shunt loss.

In contrast, in the present invention, regardless of the Cr content in the NiCr alloy or the NiFeCr alloy, the seed layer can be formed at a thickness smaller than or equal to the critical thickness, and moreover, a satisfactory exchange coupling magnetic field Hex can be obtained.

In the present invention, preferably, the Cr content in the NiCr alloy or the NiFeCr alloy is 40 to 60 atomic percent, and the thickness of the seed layer is larger than 0 Å and smaller than or equal to 38 Å.

Preferably, the Cr content in the NiCr alloy or the NiFeCr alloy is 35 to 60 atomic percent, and the thickness of the seed layer is larger than 0 Å and smaller than or equal to 30 Å. More preferably, the Cr content in the NiCr alloy or the NiFeCr alloy is 50 atomic percent or less.

In the NiFeCr alloy, preferably, the Fe/Ni atomic ratio is greater than 0/100 and less than or equal to 30/70.

The thickness of the seed layer is more preferably 6 Å or more and most preferably 12 Å or more.

In another aspect of the present invention, a magnetic sensing element includes a seed layer, an antiferromagnetic layer, a pinned magnetic layer, a nonmagnetic layer, and a free magnetic layer disposed in that order from the bottom, the magnetization of the free magnetic layer being aligned in a direction substantially perpendicular to the magnetization direction of the pinned magnetic layer. The seed layer, the antiferromagnetic layer, and the pinned magnetic layer correspond to any one of the exchange-coupled films of the present invention described above.

In another aspect of the present invention, a magnetic sensing element includes a seed layer, an antiferromagnetic exchange bias layer, a free magnetic layer, a nonmagnetic layer, a pinned magnetic layer, and an antiferromagnetic layer disposed in that order from the bottom, the magnetization of the free magnetic layer being aligned in a direction substantially perpendicular to the magnetization direction of the pinned magnetic layer. The seed layer, the exchange bias layer, and the free magnetic layer correspond to any one of the exchange-coupled films of the present invention described above.

In another aspect of the present invention, a magnetic sensing element includes a free magnetic layer, an upper nonmagnetic layer disposed on the free magnetic layer, a lower nonmagnetic layer disposed under the free magnetic layer, an upper pinned magnetic layer disposed on the upper nonmagnetic layer, a lower pinned magnetic layer disposed under the lower nonmagnetic layer, an upper antiferromagnetic layer disposed on the upper pinned magnetic layer, a lower antiferromagnetic layer disposed under the lower pinned magnetic layer, and a seed layer disposed under the lower antiferromagnetic layer, the magnetization of the free magnetic layer being aligned in a direction substantially perpendicular to the magnetization direction of the upper pinned magnetic layer and the lower pinned magnetic layer. The seed layer, the lower antiferromagnetic layer, and the lower pinned magnetic layer correspond to any one of the exchange-coupled films described above.

In another aspect of the present invention, a magnetic sensing element includes a seed layer, an antiferromagnetic exchange bias layer, a magnetoresistive layer, a nonmagnetic layer, and a soft magnetic layer. The seed layer, the exchange bias layer, and the magnetoresistive layer correspond to any one of the exchange-coupled films described above.

In the magnetic sensing element of the present invention, even if the thickness of the seed layer is decreased so as to be smaller than the critical thickness so that the total thickness and the shunt loss are decreased, since a strong exchange coupling magnetic field Hex can be generated between the antiferromagnetic layer and the ferromagnetic layer, a large change in resistance ΔRs and a high rate of change in resistance ΔRs/Rs can be maintained.

In another aspect of the present invention, a magnetic sensing element includes a pinned magnetic layer, a free magnetic layer, and a nonmagnetic layer interposed between the pinned magnetic layer and the free magnetic layer. The pinned magnetic layer includes a plurality of magnetic sublayers, the two adjacent magnetic sublayers being separated by a nonmagnetic intermediate sublayer, the plurality of magnetic sublayers including a first magnetic sublayer located farthest from the nonmagnetic layer. The first magnetic sublayer is in contact with a nonmagnetic metal layer composed of a PtMn alloy or an X—Mn alloy, wherein X is at least one element selected from the group consisting of Pt, Pd, Ir, Rh, Ru, Os, Ni, and Fe. The crystals in the nonmagnetic metal layer and the crystals in the first magnetic sublayer are epitaxial or heteroepitaxial. The end face of the pinned magnetic layer facing a recording medium is exposed. The nonmagnetic metal layer is disposed on the seed layer of the present invention described above.

In the magnetic sensing element of the present invention, even if the thickness of the seed layer is decreased so as to be smaller than the critical thickness so that the total thickness and the shunt loss are decreased, the magnetization of the pinned magnetic layer can be strongly pinned in a predetermined direction. Thereby, a large change in resistance ΔRs and a high rate of change in resistance ΔRs/Rs can be maintained.

In another aspect of the present invention, a method for making an exchange-coupled film includes the steps of:

(a) forming a seed layer at a thickness that is larger than the critical thickness so that columnar grains in the crystalline phase extend through from the upper surface to the lower surface of the seed layer;

(b) etching the upper surface of the seed layer so that the thickness of the seed layer is smaller than or equal to the critical thickness; and (c) depositing an antiferromagnetic layer and a ferromagnetic layer on the seed layer.

In the method for making the exchange-coupled film of the present invention, first, a seed layer is formed at a thickness that is larger than the critical thickness so that columnar grains in the crystalline phase extend through from the upper surface to the lower surface of the seed layer. The thickness of the seed layer is then decreased so as to be smaller than or equal to the critical thickness by etching. Once the columnar grains in the crystalline phase which extend through from the upper surface to the lower surface of the seed layer are formed, even if the seed layer is etched, the shape of the columnar grains in the crystalline phase is maintained so that the columnar grains extend through from the upper surface to the lower surface.

Consequently, by using the method for making the exchange-coupled film of the present invention, even if the thickness of the seed layer is decreased so as to be smaller than the critical thickness, it is possible to obtain an exchange-coupled film capable of producing a strong exchange coupling magnetic field Hex between the antiferromagnetic layer and the ferromagnetic layer.

In another aspect of the present invention, a method for making an exchange-coupled film includes the steps of:

(d) forming a seed layer with a crystalline phase at a thickness that is larger than the critical thickness;

(e) etching a surface of the seed layer so that the thickness of the seed layer is smaller than or equal to the critical thickness and so that the average crystal grain size, in a direction parallel to the layer surface, of the crystal grains in the seed layer is larger than the thickness of the seed layer; and (f) depositing an antiferromagnetic layer and a ferromagnetic layer on the seed layer.

In the method for making the exchange-coupled film of the present invention, first, a seed layer is formed at a thickness that is larger than the critical thickness, and the thickness of the seed layer is then decreased so as to be smaller than or equal to the critical thickness by etching. If the seed layer is formed at a thickness that is larger than the critical thickness, the size of the crystal grains formed in the seed layer becomes sufficiently large. Even if the seed layer is etched after the formation, the crystal grain size of the crystals formed in the seed layer is maintained.

Consequently, by using the method for making the exchange-coupled film of the present invention, even if the thickness of the seed layer is decreased so as to be smaller than the critical thickness, the average crystal grain size, in a direction parallel to the layer surface, of the crystal grains in the seed layer can be set to be larger than the thickness of the seed layer, and it is possible to obtain an exchange-coupled film capable of producing a strong exchange coupling magnetic field Hex between the antiferromagnetic layer and the ferromagnetic layer.

In the present invention, in step (a) or step (d), preferably, the seed layer is formed using a metal material which has a face-centered cubic (fcc) structure and a crystalline phase in which the equivalent crystal plane represented as {111} plane is preferentially oriented parallel to the interface between the antiferromagnetic layer and the ferromagnetic layer.

In the present invention, the seed layer is, for example, composed of a NiCr alloy or a NiFeCr alloy.

In another aspect of the present invention, a method for making an exchange-coupled film includes the steps of:

(g) forming a seed layer at a thickness that is larger than the critical thickness using a NiCr alloy or a NiFeCr alloy with a Cr content of 35 to 60 atomic percent;

(h) etching a surface of the seed layer so that the thickness of the seed layer is smaller than or equal to the critical thickness; and (i) depositing an antiferromagnetic layer and a ferromagnetic layer on the seed layer.

In the method for making the exchange-coupled film of the present invention, first, a seed layer is formed at a thickness that is larger than the critical thickness, and the thickness of the seed layer is then decreased so as to be smaller than or equal to the critical thickness by etching. In the present invention, regardless of the Cr content in the NiCr alloy or the NiFeCr alloy, the seed layer can be formed at a thickness that is smaller than or equal to the critical thickness, and moreover, it is possible to obtain a satisfactory exchange coupling magnetic field Hex.

Preferably, the Cr content in the NiCr alloy or the NiFeCr alloy is 40 to 60 atomic percent, and in step (b), (e), or (h), the seed layer is etched so that the thickness of the seed layer is larger than 0 Å and smaller than or equal to 38 Å.

More preferably, the Cr content in the NiCr alloy or the NiFeCr alloy is 35 to 60 atomic percent, and in step (b), (e), or (h), the seed layer is etched so that the thickness of the seed layer is larger than 0 Å and smaller than or equal to 30 Å.

Most preferably, the Cr content in the NiCr alloy or the NiFeCr alloy is 50 atomic percent or less.

In the NiFeCr alloy, preferably, the Fe/Ni atomic ratio is greater than 0/0100 and less than or equal to 30/70.

The thickness of the seed layer is more preferably 6 Å or more, and most preferably 12 Å or more.

When a self-pinned magnetic sensing element is fabricated, instead of step (c), (f), or (i), step (j) of depositing a ferromagnetic layer on the seed layer is performed.

Additionally, as in the present invention, when the surface of the seed layer is etched, the Cr concentration at the outermost surface of the finished seed layer may be slightly lower than the Cr concentration inside the seed layer and the Ni concentration at the outermost surface of the finished seed layer may be slightly higher than the Ni concentration inside the seed layer. If such a concentration gradient occurs, it is believed that the surface energy of the seed layer changes, and the wettability of the surface of the seed layer improves, resulting in an increase in the exchange coupling magnetic field Hex between the antiferromagnetic layer and the ferromagnetic layer. This concentration gradient is caused by the step of etching the surface of the seed layer and does not occur in the conventional seed layer.

DESCRIPTION OF THE PREFERRED EMBODIMENTS

Figure 1:
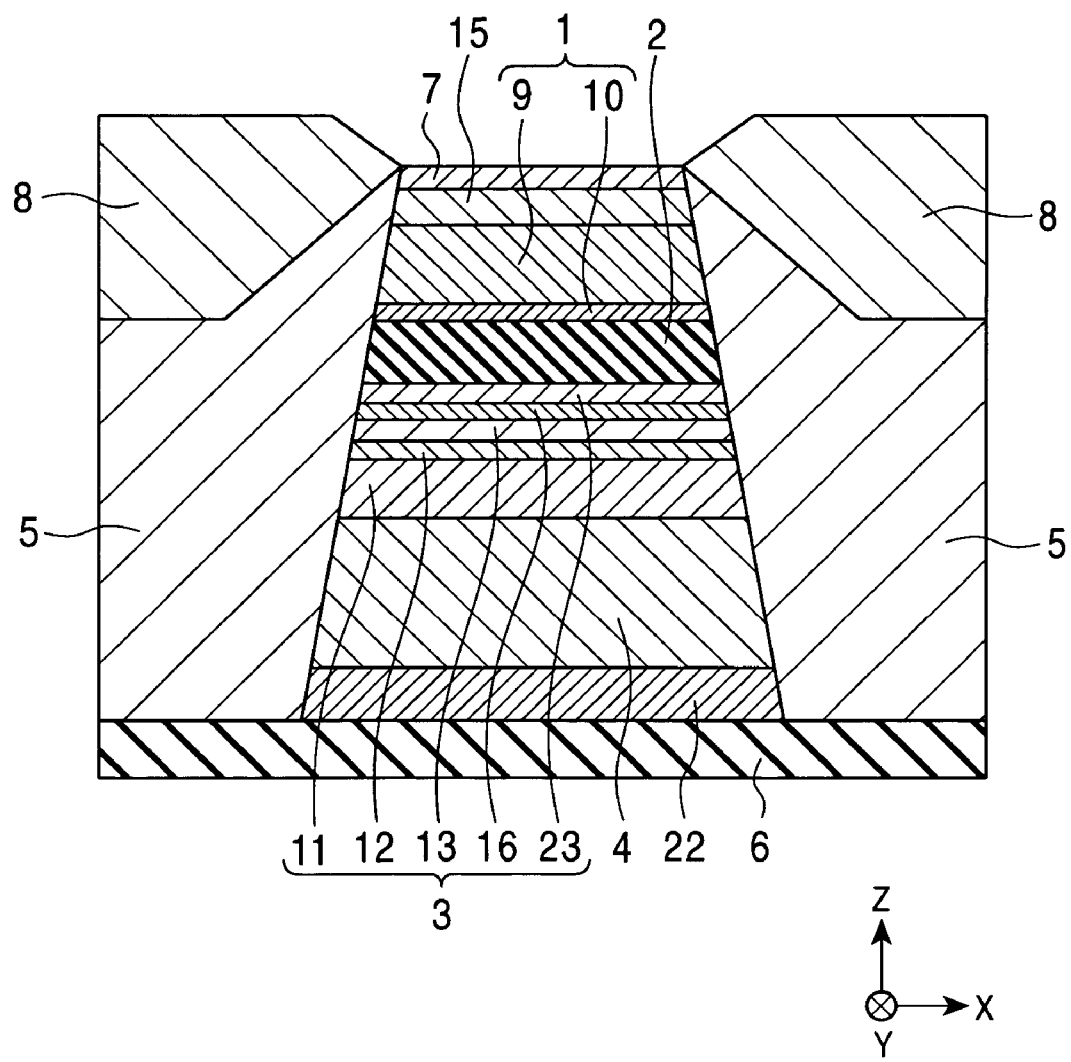
FIG. 1 is a sectional view of a magnetic sensing element (single spin-valve magnetoresistive element) in a first embodiment of the present invention, viewed from a surface facing a recording medium.

FIG. 1 is a sectional view which shows an overall structure of a magnetic sensing element (single spin-valve magnetoresistive element) in a first embodiment of the present invention, viewed from a surface facing a recording medium. FIG. 1 shows only a central region of the element extending in the X direction.

The single spin-valve magnetoresistive element is mounted on the training end of a floating-type slider provided on a hard disk drive or the like to detect magnetic fields recorded on a hard disk or the like. The magnetic recording medium, such as a hard disk, travels in the Z direction, and a leakage magnetic field from the magnetic recording medium is applied in the Y direction.

As shown in FIG. 1, a seed layer 22, an antiferromagnetic layer 4, a pinned magnetic layer 3, a nonmagnetic layer 2, and a free magnetic layer 1 are disposed on an insulating layer 6 composed of alumina or the like. Additionally, an underlayer composed of a nonmagnetic material, such as at least one element selected from the group consisting of Ta, Hf, Nb, Zr, Ti, Mo, and W, may be disposed under the seed layer 22.

The antiferromagnetic layer 4 disposed on the seed layer 22 is preferably composed of an antiferromagnetic material containing X and Mn, wherein X is at least one element selected from the group consisting of Pt, Pd, Ir, Rh, Ru, and Os.

The X—Mn alloys containing such platinum group elements have excellent characteristics as antiferromagnetic materials because they exhibit superior corrosion resistance and high blocking temperatures and can generate large exchange coupling magnetic fields (Hex). In particular, Pt is preferable among the platinum group elements. For example, a binary PtMn alloy may be used.

In the present invention, the antiferromagnetic layer 4 may be composed of an antiferromagnetic material containing X, X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Preferably, an element or elements which form a solid solution by entering the interstices in the space lattice composed of X and Mn or by partially replacing the lattice points in the crystal lattice composed of X and Mn are used as X'. Herein, the term "solid solution" refers to a solid in which its components are homogeneously mixed over wide ranges.

The X—Mn—X' alloy as the interstitial or substitutional solid solution has a larger lattice constant compared with that of the X—Mn alloy. As a result, the difference between the lattice constant of the antiferromagnetic layer 4 and that of the pinned magnetic layer 3 can be increased so that a noncoherent state is brought about easily in the interface structure between the antiferromagnetic layer 4 and the pinned magnetic layer 3. Herein, the term "noncoherent state" refers to a state in which the atoms constituting the antiferromagnetic layer 4 and the atoms constituting the pinned magnetic layer 3 do not exhibit one-to-one correspondence at the interface between the antiferromagnetic layer 4 and the pinned magnetic layer 3.

When an element or elements which form a substitutional solid solution are used as X', if the X' content becomes excessive, the antiferromagnetic characteristics are degraded, and the magnitude of the exchange coupling magnetic field generated at the interface with the pinned magnetic layer 3 is decreased. In the present invention, X' is preferably at least one inert rare gas element selected from the group consisting of Ne, Ar, Kr, and Xe which forms an interstitial solid solution. Since rare gas elements are inert, these gases do not substantially affect the antiferromagnetic characteristics even when they are contained in the layers. Moreover, for example, Ar, which is commonly used as a sputtering gas in sputtering apparatuses, can readily enter the layer by simply adjusting the gas pressure properly.

When a gaseous element or elements are used as X', it is difficult for the layer to contain a large amount of the element X'. However, by only allowing a small amount of these rare gases to enter the layer, the exchange coupling magnetic field generated by annealing can be remarkably increased.

In the present invention, the X' content is preferably 0.2 to 10 atomic percent, and more preferably 0.5 to 5 atomic percent. Since Pt is preferred as X in the present invention, a Pt—Mn—X' alloy is preferably used.

In the present invention, the X content or the X+X' content in the antiferromagnetic layer 4 is preferably in the range of 45 to 60 atomic percent, and more preferably in the range of 49 to 56.5 atomic percent. Consequently, the interface with the pinned magnetic layer 3 is put into a noncoherent state during deposition, and moreover, the antiferromagnetic layer 4 can achieve an adequate order transformation by annealing.

The pinned magnetic layer 3 disposed on the antiferromagnetic layer 4 has a five-layered structure. The pinned magnetic layer 3 includes a magnetic sublayer 11, a nonmagnetic intermediate sublayer 12, a magnetic sublayer 13, a specular reflection layer 16, and a magnetic sublayer 23. The magnetization directions of the magnetic sublayer 11 and the magnetic sublayers 13 and 23 are set to be antiparallel to each other (the magnetization directions of the magnetic sublayers 13 and 23 being parallel to each other) due to an exchange coupling magnetic field at the interface with the antiferromagnetic layer 4 and an antiferromagnetic exchange coupling magnetic field (RKKY interaction) generated via the nonmagnetic intermediate sublayer 12. This antiparallel state is called as a synthetic ferrimagnetic coupling state. Such a structure can stabilize the magnetization of the pinned magnetic layer 3 and also increase the apparent exchange coupling magnetic field generated at the interface between the pinned magnetic layer 3 and the antiferromagnetic layer 4.

In this embodiment, the specular reflection layer 16 is disposed between the magnetic sublayer 13 and the magnetic sublayer 23. By providing the specular reflection layer 16, spin-up conduction electrons among the conduction electrons moving through the nonmagnetic layer 2 when a sensing current is applied can be specularly reflected at the interface between the specular reflection layer 16 and the magnetic sublayer 23 with the spin direction being maintained. Thereby, the mean free path of the spin-up electrons are extended and the difference in the mean free path between the spin-up electrons and spin-down electrons is increased, resulting in an increase in the rate of change in resistance ($\Delta Rs/Rs$).

With respect to the specular reflection layer 16, after the magnetic sublayer 13 is formed, the surface of the magnetic sublayer 13 is oxidized, and the oxidized portion of the magnetic sublayer 13 may be allowed to function as the specular reflection layer 16. For example, the magnetic sublayer 13 is composed of a CoFe alloy, and the surface thereof is oxidized. Thereby, a specular reflection layer 16 composed of Co—Fe—O can be formed on the surface of the magnetic sublayer 13. In the present invention, preferably, the magnetic sublayers 11 and 23 are also composed of a CoFe alloy. Alternatively, the magnetic sublayers 11, 13, and 23 may be composed of a magnetic material, such as a NiFe alloy, a CoFeNi alloy, or Co.

In another method, a specular reflection layer 16 composed of FeMO or the like, wherein M is at least one element selected from the group consisting of Mn, Co, Ni, Ba, Sr, Y, Gd, Cu, and Zn, is formed by sputtering on the magnetic sublayer 13 or directly on the nonmagnetic intermediate sublayer 12 without forming the magnetic sublayer 13, and the magnetic sublayer 23 is then formed thereon.

In the embodiment shown in FIG. 1, the pinned magnetic layer 3 has a laminated ferrimagnetic structure. The pinned magnetic layer 3 may have a single-layered structure or a multilayered structure including magnetic sublayers.

The magnetic sublayer 11, for example, has a thickness of 12 to 20 Å, the nonmagnetic intermediate sublayer 12 has a thickness of about 8 Å, and each of the magnetic sublayers 11 and 13 has a thickness of 5 to 20 Å.

The nonmagnetic intermediate sublayer 12 is composed of a nonmagnetic conductive material, such as Ru, Rh, Ir, Cr, Re, or Cu.

The nonmagnetic layer 2 disposed on the pinned magnetic layer 3 is, for example, composed of Cu. When the magnetic sensing element of the present invention is applied to a tunneling magnetoresistive element (TMR element) utilizing the tunneling effect, the nonmagnetic layer 2 is composed of an insulating material, such as $Al_2O_3$.

The free magnetic layer 1 having a two-layered structure is disposed on the nonmagnetic layer 2.

The free magnetic layer 1, for example, includes a NiFe alloy sublayer 9 and a CoFe alloy sublayer 10. As shown in FIG. 1, by forming the CoFe alloy sublayer 10 so as to be in contact with the nonmagnetic layer 2, diffusion of metallic elements, etc., can be prevented at the interface with the nonmagnetic layer 2, and the rate of change in resistance ($\Delta Rs/Rs$) can be increased.

The NiFe alloy sublayer 9, for example, contains 80 atomic percent of Ni and 20 atomic percent of Fe. The CoFe alloy sublayer 10, for example, contains 90 atomic percent of Co and 10 atomic percent of Fe. For example, the NiFe alloy sublayer 9 has a thickness of about 35 Å, and the CoFe alloy sublayer 10 has a thickness of about 10 Å. Instead of the CoFe alloy sublayer 10, Co, CoFeNi alloy, or the like may be used. The free magnetic layer 1 may have a single-layered structure or a multilayered structure including magnetic sublayers. In such a case, the free magnetic layer 1 preferably has a single-layered structure composed of a CoFeNi alloy. The free magnetic layer 1 may have a laminated ferrimagnetic structure as in the pinned magnetic layer 3.

A back layer 15 composed of a metal or nonmagnetic metal, such as Cu, Au, or Ag, is disposed on the free magnetic layer 1. For example, the thickness of the back layer 15 is 20 Å or less.

A protective layer 7 is disposed on the back layer 15. The protective layer 7 is preferably a specular reflection layer composed of an oxide of Ta or the like.

By disposing the back layer 15, the mean free path of spin-up electrons which contribute to the magnetoresistance effect can be extended, and a large rate of change in resistance ($\Delta Rs/Rs$) can be obtained in the spin-valve magnetic element because of a so-called "spin filter effect", and thus the magnetic element becomes suitable for higher recording densities. Additionally, the back layer 15 may be omitted.

By providing the specular reflection layer 7 on the back layer 15, spin-up conduction electrons can be specularly reflected at the specular reflection layer 7 so that the mean free path of conduction electrons can be extended, resulting in a further improvement in the rate of change in resistance ($\Delta Rs/Rs$).

Examples of materials used for the specular reflection layer 7 include, in addition to the oxide of Ta, oxides, such as Fe—O (e.g., $\alpha$-$Fe_2O_3$, FeO, and $Fe_3O_4$), Ni—O, Co—O, Co—Fe—O, Co—Fe—NiO, Al—O, Al-Q-O (wherein Q is at least one element selected from the group consisting of B, Si, N, Ti, V, Cr, Mn, Fe, Co, and Ni), and R—O (wherein R is at least one element selected from the group consisting of Ti, V, Cr, Zr, Nb, Mo, Hf, and W); nitrides, such as Al—N, Al-Q-N (wherein Q is at least one element selected from the group consisting of B, Si, O, Ti, V, Cr, Mn, Fe, Co, and Ni), and R—N (wherein R is at least one element selected from the group consisting of Ti, V, Cr, Zr, Nb, Mo, Hf, Ta, and W); and semimetallic Heusler alloys, such as NiMnSb and PtMnSb. These materials are also applicable to the specular reflection layer 16 formed in the pinned magnetic layer 3.

In the embodiment shown in FIG. 1, hard bias layers 5 and electrode layers 8 are disposed at both sides of the laminated film including the insulating layer 6 to the protective layer (specular reflection layer) 7. The magnetization of the free magnetic layer 1 is aligned in the track width direction (in the X direction in the drawing) by a longitudinal magnetic field from the hard bias layers 5.

The hard bias layers 5 are composed of a Co—Pt alloy, a Co—Cr—Pt alloy, or the like. The electrode layers 8 are composed of α-Ta, Au, Cr, Cu, Rh, Ir, Ru, W, or the like. Additionally, in the tunneling magnetoresistive element described above or a magnetic sensing element of a current-perpendicular-to-the-plane (CPP) type, one of the electrode layers 8 is formed above the free magnetic layer 1 and the other is formed below the antiferromagnetic layer 4. In such a case, the specular reflection layer 16 is not formed.

In the spin-valve thin-film element shown in FIG. 1, after the layers from the insulating layer 6 to the protective layer 7 are deposited, annealing is performed to generate an exchange coupling magnetic field at the interface between the antiferromagnetic layer 4 and the pinned magnetic layer 3. At this stage, by directing the magnetic field parallel to the Y direction, the magnetization of the pinned magnetic layer 3 is directed and pinned parallel to the Y direction. In the embodiment shown in FIG. 1, since the pinned magnetic layer 3 has a laminated ferrimagnetic structure, when the magnetic sublayer 11 is magnetized, for example, in the Y direction, the magnetic sublayer 13 and the magnetic sublayer 23 are magnetized in a direction opposite to the Y direction.

In this embodiment, the seed layer 22 is disposed under the antiferromagnetic layer 4. The seed layer 22 is a metal layer composed of a NiFeCr alloy or NiCr alloy. The Cr content in the NiFeCr alloy or NiCr alloy is 35 to 60 atomic percent.

In the present invention, the thickness of the seed layer 22 is smaller than or equal to the critical thickness of the seed layer 22. The thickness of the seed layer 22 at the critical point below which the exchange coupling magnetic field Hex at the interface between the antiferromagnetic layer 4 and the pinned magnetic layer 3, the unidirectional exchange bias magnetic field Hex*, and the change in resistance $\Delta Rs$ and the rate of change in magnetoresistance $\Delta Rs/Rs$ of the magnetic sensing element rapidly decrease is referred to as a critical thickness of the seed layer 22.

If a seed layer is formed at a thickness that is smaller than or equal to the critical thickness, the change in resistance $\Delta Rs$ and the rate of change in magnetoresistance $\Delta Rs/Rs$ of a thin-film magnetic sensing element formed on the seed layer become too low for practical use.

The critical thickness depends on the composition and compositional ratio of the material constituting the seed layer. For example, when the seed layer is composed of a $(Ni_{0.8}Fe_{0.2})_{60}Cr_{40}$ alloy, the critical thickness is 38 Å. As the Cr content in the NiFeCr alloy increases, the critical thickness increases. As the Cr content decreases, the critical thickness decreases.

In this embodiment of the present invention, the thickness of the seed layer 22 composed of a $(Ni_{0.8}Fe_{0.2})_{60}Cr_{40}$ alloy can be set at a value that is smaller than or equal to the critical thickness, i.e., 38 Å, for example, at 20 Å.

In this embodiment, although the seed layer 22 has a thickness that is smaller than or equal to the critical thickness, i.e., 38 Å, the seed layer 22 has a crystalline phase which extends through from the upper surface to the lower surface of the seed layer 22, and moreover, the average crystal grain size, in a direction parallel to the layer surface, of the crystal grains in the seed layer 22 is larger than the thickness of the seed layer 22. Additionally, the average crystal grain size of the seed layer 22 can be set at about 80 to 120 Å.

As will be shown in the experimental results described below, even if the seed layer 22 composed of a $(Ni_{0.8}Fe_{0.2})_{60}Cr_{40}$ alloy has a thickness that is smaller than or equal to the critical thickness, i.e., 38 Å, a rate of change in resistance of 13% or more can be obtained, and a unidirectional exchange bias magnetic field Hex* of $16.0 \times 10^4$ A/m or more can also be obtained.

Herein, the unidirectional exchange bias magnetic field Hex* is defined as the magnitude of the external magnetic field when the rate of change in resistance $\Delta Rs/Rs$ is half the maximum value.

The unidirectional exchange bias magnetic field Hex* includes the exchange coupling magnetic field generated between the pinned magnetic layer 3 and the antiferromagnetic layer 4 and the coupling magnetic field generated between the CoFe alloys constituting the pinned magnetic layer 3 having the laminated ferrimagnetic structure as a result of the RKKY interaction.

Consequently, when the pinned magnetic layer 3 does not have a laminated ferrimagnetic structure, the unidirectional exchange bias magnetic field Hex* primarily means the exchange coupling magnetic field generated between the pinned magnetic layer 3 and the antiferromagnetic layer 4. On the other hand, when the pinned magnetic layer 3 has the laminated ferrimagnetic structure shown in FIG. 1, the unidirectional exchange bias magnetic field Hex* primarily means the total of the exchange coupling magnetic field and the coupling magnetic field as a result of the RKKY interaction.

As the unidirectional exchange bias magnetic field Hex* is increased, the pinned magnetic layer 3 can be more properly pinned in a predetermined direction. Even in the high-temperature atmosphere, the magnetization of the pinned magnetic layer 3 can be maintained in a strongly pinned state. Thereby, electromigration is prevented from occurring, and so-called current-carrying reliability can be appropriately improved.

The crystalline phase of the seed layer 22 has a face-centered cubic (fcc) structure, and the equivalent crystal plane represented as {111} plane is preferentially oriented parallel to the interface.

In the present invention, even if the Cr content in the NiCr alloy or NiFeCr alloy constituting the seed layer 22 is 40 to 60 atomic percent, the thickness of the seed layer 22 can be set at larger than 0 Å and smaller than or equal to 38 Å.

Furthermore, even if the Cr content in the NiCr alloy or NiFeCr alloy constituting the seed layer 22 is 35 to 60 atomic percent, the thickness of the seed layer 22 can be set at larger than 0 Å and smaller than or equal to 30 Å. Preferably, the Cr content in the NiCr alloy or NiFeCr alloy constituting the seed layer 22 is 50 atomic percent or less.

The thickness of the seed layer 22 is preferably 6 Å or more, and more preferably 10 Å or more.

In the magnetic sensing element in this embodiment, even if the total thickness and the shunt loss of the magnetic sensing element are decreased by setting the thickness of the seed layer 22 to be smaller than the critical thickness, a strong unidirectional exchange bias magnetic field Hex* can be generated, and a large change in resistance ΔRs and a high rate of change in resistance ΔRs/Rs can be maintained.

The seed layer 22 is also applicable to other magnetic sensing elements with different film structures.

Figure 2:
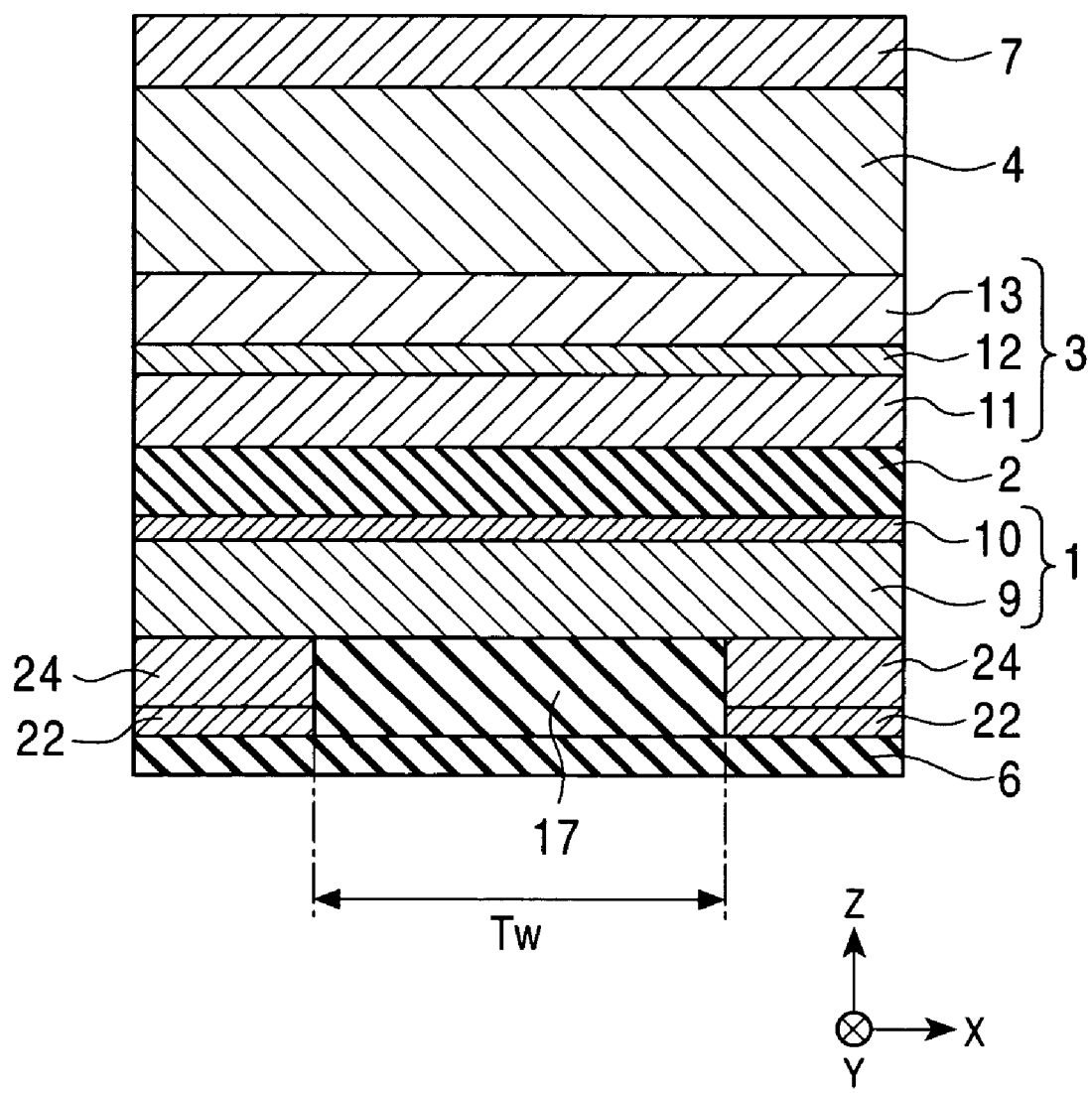
FIG. 2 is a sectional view of a magnetic sensing element (single spin-valve magnetoresistive element) in a second embodiment of the present invention, viewed from a surface facing a recording medium.

FIG. 2 is a partial sectional view which shows a structure of a magnetic sensing element (single spin-valve thin-film element) in a second embodiment of the present invention, viewed from a surface facing a recording medium.

In the spin-valve thin-film element shown in FIG. 2, a pair of seed layers 22 are disposed on an insulating layer 6 composed of alumina or the like, the seed layers 22 being separated from each other with a distance corresponding to a track width Tw in the track width direction (in the X direction). Exchange bias layers 24 are disposed on the seed layers 22.

The spaces between the seed layers 22 and between the exchange bias layers 24 are filled with an insulating layer 17 composed of an insulating material, such as $SiO_2$ or $Al_2O_3$.

A free magnetic layer 1 is disposed over the exchange bias layers 24 and the insulating layer 17.

The exchange bias layer 24 is composed of the X—Mn alloy or the X—Mn—X' alloy, and the X content or the X+X' content is preferably in the range of 45 to 60 atomic percent, and more preferably in the range of 49 to 56.5 atomic percent.

In each side region of the free magnetic layer 1, the magnetization is aligned in a single-domain state in the X direction by the coupling magnetic field generated between the exchange bias layer 24 and the free magnetic layer 1. The magnetization of the central region of the free magnetic layer 1 corresponding to the track width Tw is properly aligned in the X direction to so as to be rotated in response to an external magnetic field.

As shown in FIG. 2, a nonmagnetic layer 2 is disposed on the free magnetic layer 1, and a pinned magnetic layer 3 is further disposed on the nonmagnetic layer 2. An antiferromagnetic layer 4 and a protective layer 7 are disposed on the pinned magnetic layer 3.

In this embodiment, it is also possible to set the thickness of the seed layer 22 composed of a $(Ni_{0.8}Fe_{0.2})_{60}Cr_{40}$ alloy to be smaller than or equal to the critical thickness, i.e., 38 Å, for example, at 20 Å.

In this embodiment, although the seed layer 22 has a thickness that is smaller than or equal to the critical thickness, i.e., 38 Å, the seed layer 22 also has a crystalline phase which extends through from the upper surface to the lower surface of the seed layer 22, and moreover, the average crystal grain size, in a direction parallel to the layer surface, of the crystal grains in the seed layer 22 is larger than the thickness of the seed layer 22. Additionally, the average crystal grain size of the seed layer 22 can be set at about 80 to 120 Å.

In this embodiment, even if the total thickness and the shunt loss of the magnetic sensing element are decreased by setting the thickness of the seed layer 22 to be smaller than the critical thickness, a strong unidirectional exchange bias magnetic field Hex* can also be generated, and a large change in resistance ΔRs and a high rate of change in magnetoresistance ΔRs/Rs can be maintained.

Figure 3:
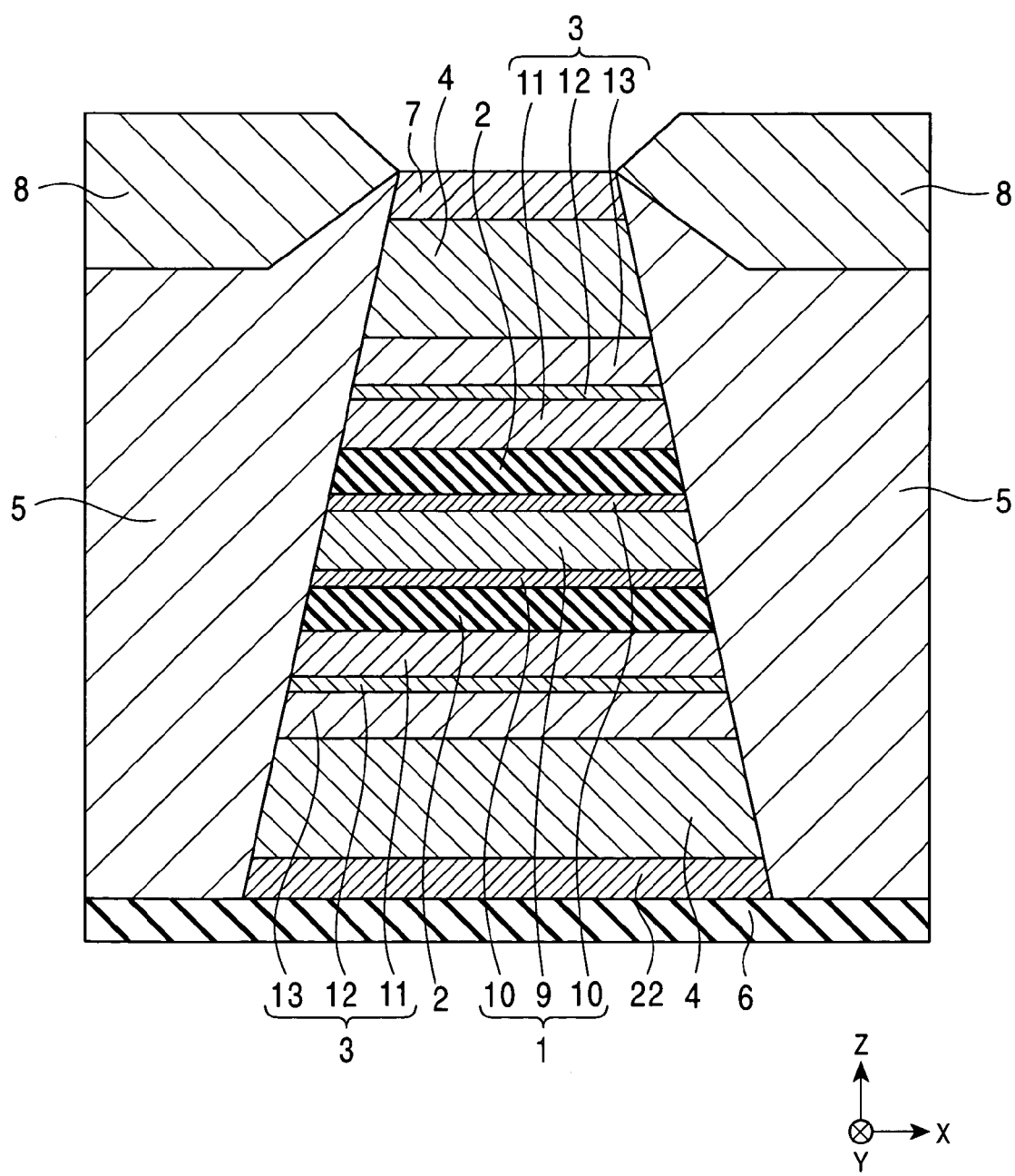
FIG. 3 is a sectional view of a magnetic sensing element (dual spin-valve magnetoresistive element) in a third embodiment of the present invention, viewed from a surface facing a recording medium.

FIG. 3 is a partial sectional view which shows a dual spin-valve thin-film element in a third embodiment of the present invention.

As shown in FIG. 3, on an insulating layer 6 composed of alumina or the like, a seed layer 22, a lower antiferromagnetic layer 4, a lower pinned magnetic layer 3, a lower nonmagnetic layer 2, and a free magnetic layer 1 are continuously deposited. The free magnetic layer 1 has a three-layered structure including, for example, CoFe sublayers 10 and a NiFe layer 9. Furthermore, on the free magnetic layer 1, an upper nonmagnetic layer 2, an upper pinned magnetic layer 3, and an upper antiferromagnetic layer 4, and a protective layer 7 are continuously deposited.

Hard bias layers 5 and electrode layers 8 are disposed at both sides of the laminated film including the insulating layer 6 to the protective layer 7. The individual layers are composed of the same materials as those described with reference to FIG. 1.

In this embodiment, the seed layer 22 is disposed under the lower antiferromagnetic layer 4 below the free magnetic layer 1. The X content or the X+X' content in the antiferromagnetic layer 4 is preferably in the range of 45 to 60 atomic percent, and more preferably in the range of 49 to 56.5 atomic percent.

In this embodiment, it is also possible to set the thickness of the seed layer 22 composed of a $(Ni_{0.8}Fe_{0.2})_{60}Cr_{40}$ alloy at a value that is smaller than or equal to the critical thickness, i.e., 38 Å, for example, at 20 Å.

Although the seed layer 22 has a thickness that is smaller than or equal to the critical thickness, i.e., 38 Å, the seed layer 22 has a crystalline phase which extends through from the upper surface to the lower surface of the seed layer 22, and moreover, the average crystal grain size, in a direction parallel to the layer surface, of the crystal grains in the seed layer 22 is larger than the thickness of the seed layer 22.

Even if the total thickness and the shunt loss of the magnetic sensing element are decreased by setting the thickness of the seed layer 22 to be smaller than the critical thickness, a strong unidirectional exchange bias magnetic field Hex* can be generated, and a large change in resistance ΔRs and a high rate of change in magnetoresistance ΔRs/Rs can be maintained.

Figure 4:
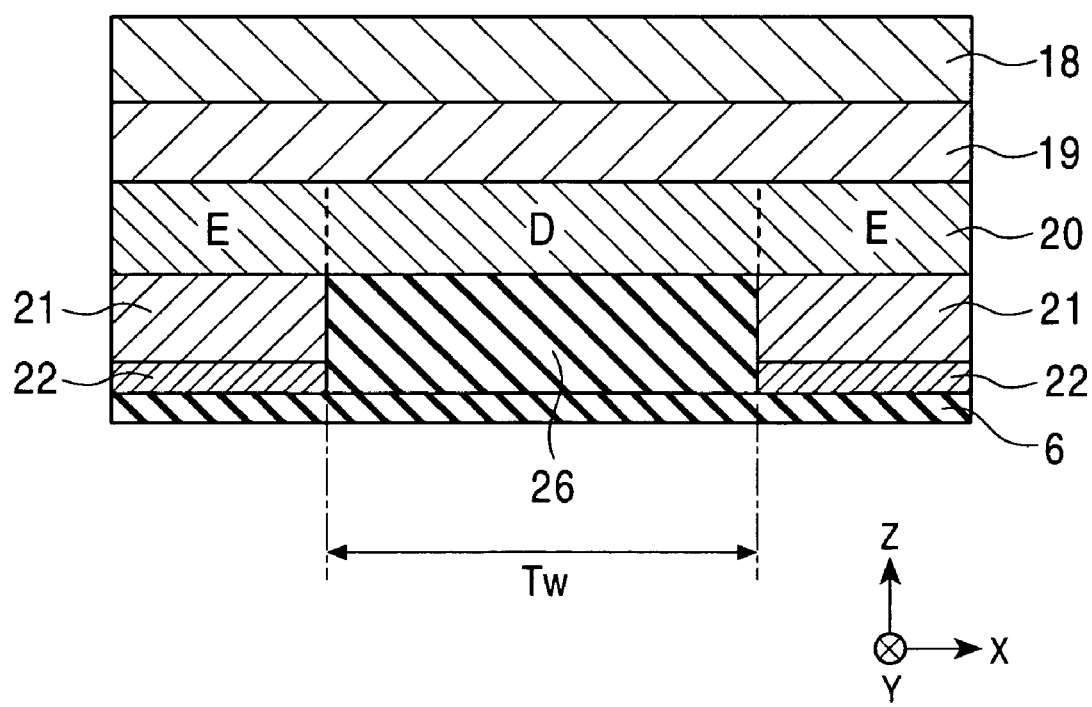
FIG. 4 is a sectional view of a magnetic sensing element (anisotropic magnetoresistive (AMR) element) in a fourth embodiment of the present invention, viewed from a surface facing a recording medium.

FIG. 4 is a partial sectional view of an anisotropic magnetoresistive (AMR) element in a fourth embodiment of the present invention, viewed from a surface facing a recording medium.

In the magnetoresistive element shown in FIG. 4, a pair of seed layers 22 are disposed on an insulating layer 6 composed of alumina or the like, the seed layers 22 being separated from each other with a distance corresponding to a track width Tw in the track width direction (in the X direction). Exchange bias layers 21 are disposed on the seed layers 22. The spaces between the seed layers 22 and between the exchange bias layers 21 are filled with an insulating layer 26 composed of an insulating material, such as $SiO_2$ or $Al_2O_3$.

A magnetoresistive layer (MR layer) 20, a nonmagnetic layer (shunt layer) 19, and a soft magnetic layer (SAL layer) 18 are disposed over the exchange bias layers 21 and the insulating layer 26.

In the AMR thin film element shown in FIG. 4, the regions E of the magnetoresistive layer 20 are put into a single-domain state in the X direction by the exchange coupling magnetic fields generated at the interfaces between the magnetoresistive layer 20 and the exchange bias layers 21. The magnetization of the region D of the magnetoresistive layer 20 is aligned in the X direction by the influence of the E regions. The magnetic field which is induced when a sensing current flows in the magnetoresistive layer 20 is applied to the soft magnetic layer 18 in the Y direction. A transverse bias magnetic field is applied to the region D of the magnetoresistive layer 20 in the Y direction by the magnetostatic coupling energy induced by the soft magnetic layer 18. Application of the transverse bias magnetic field to the region D of the magnetoresistive layer 20 which is put into the single-domain state in the X direction results in linearity in the change in resistance in response to the change in the magnetic field of the region D of the magnetoresistive layer 20 (the magnetoresistive effect: the H-R effect).

A recording medium travels in the Z direction. When the leakage magnetic field is applied in the Y direction, the resistance in the region D of the magnetoresistive layer 20 is changed. This change is detected as a change in voltage.

In this embodiment, it is also possible to set the thickness of the seed layer 22 composed of a $(Ni_{0.8}Fe_{0.2})_{60}Cr_{40}$ alloy at a value that is smaller than or equal to the critical thickness, i.e., 38 Å, for example, at 20 Å.

Although the seed layer 22 has a thickness that is smaller than or equal to the critical thickness, i.e., 38 Å, the seed layer 22 has a crystalline phase which extends through from the upper surface to the lower surface of the seed layer 22, and moreover, the average crystal grain size, in a direction parallel to the layer surface, of the crystal grains in the seed layer 22 is larger than the thickness of the seed layer 22. The average crystal grain size of the seed layer can be set at about 80 to 120 Å.

Even if the total thickness and the shunt loss of the magnetic sensing element are decreased by setting the thickness of the seed layer 22 to be smaller than the critical thickness, a strong exchange coupling magnetic field Hex can be generated, and a large change in resistance $\Delta Rs$ and a high rate of change in magnetoresistance $\Delta Rs/Rs$ can be maintained.

Figure 5:
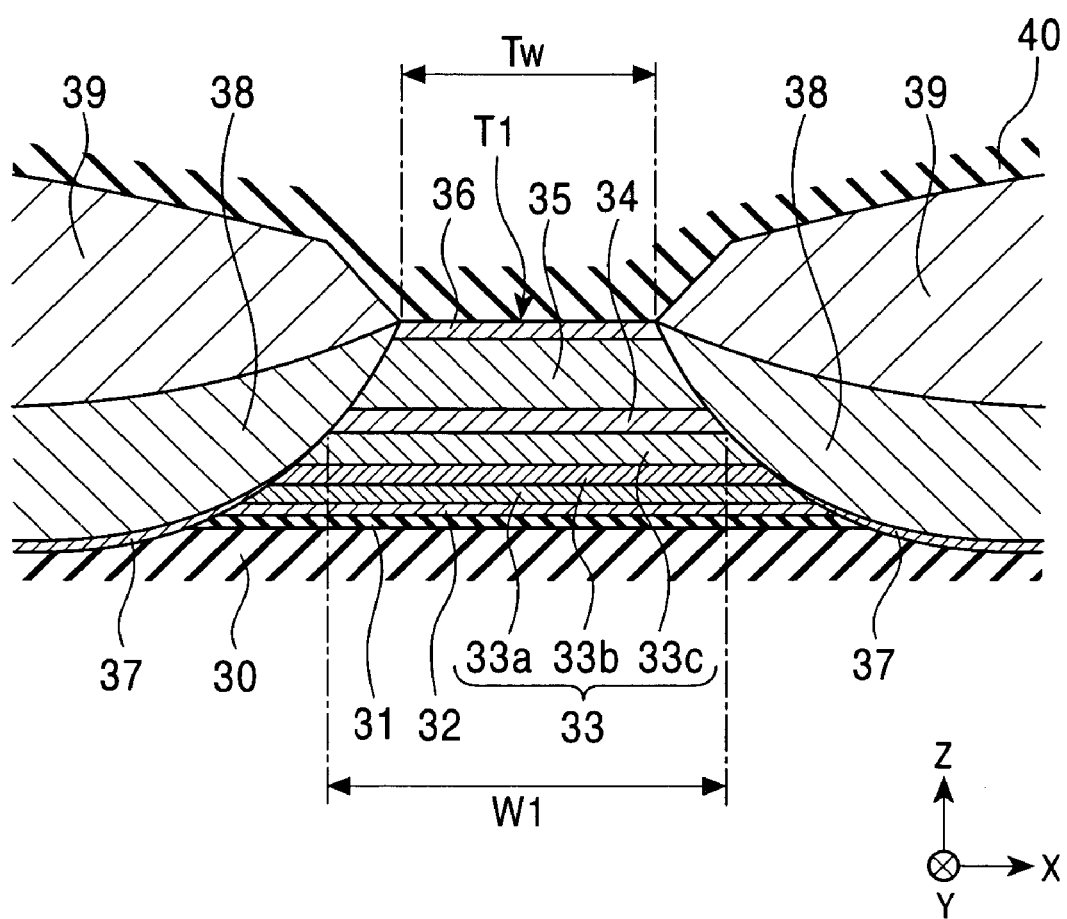
FIG. 5 is a sectional view of a magnetic sensing element (self-pinned magnetoresistive element) in a fifth embodiment of the present invention, viewed from a surface facing a recording medium.

FIG. 5 is a sectional view of a magnetic sensing element in a fifth embodiment of the present invention, viewed from a surface facing a recording medium.

In the magnetic sensing element shown in FIG. 5, a laminate T1 is disposed on a lower gap layer 30 composed of an insulating material, such as alumina.

The laminate T1 includes a seed layer 31, a nonmagnetic metal layer 32, a pinned magnetic layer 33, a nonmagnetic layer 34, a free magnetic layer 35, and a protective layer 36 disposed in that order from the bottom.

The nonmagnetic metal layer 32 will be described later.

The pinned magnetic layer 33 has a synthetic ferrimagnetic structure including a first magnetic sublayer 33a and a second magnetic sublayer 33c separated by a nonmagnetic intermediate sublayer 33b. The magnetization of the pinned magnetic layer 33 is pinned in the height direction (in the Y direction in the drawing) by the uniaxial magnetic anisotropy of the pinned magnetic layer 33 itself.

The nonmagnetic layer 34 inhibits the pinned magnetic layer 33 and the free magnetic layer 35 from being magnetically coupled to each other, and is preferably composed of a nonmagnetic material, such as Cu. Au, or Pt. More preferably, the nonmagnetic layer 34 is composed of Cu. The thickness of the nonmagnetic layer 34 is 17 to 30 Å.

The free magnetic layer 35 is composed of a magnetic material, such as a NiFe alloy or CoFe alloy. In the embodiment shown in FIG. 5, in particular, when the free magnetic layer 35 is composed of a NiFe alloy, a diffusion-preventing layer (not shown in the drawing) composed of Co or CoFe is preferably disposed between the free magnetic layer 35 and the nonmagnetic layer 34. The thickness of the free magnetic layer 35 is 20 to 60 Å. The free magnetic layer 35 may have a synthetic ferrimagnetic structure including a plurality of magnetic sublayers, the two adjacent magnetic sublayers being separated by a nonmagnetic intermediate sublayer.

The protective layer 36 is composed of Ta or the like and prevents the oxidation of the laminate T1 from advancing. The thickness of the protective layer 36 is 10 to 50 Å.

In this embodiment, bias underlayers 37, hard bias layers 38, and electrode layers 39 are disposed at both sides of the laminate T1 including the seed layer 31 to the protective layer 36. The magnetization of the free magnetic layer 35 is aligned in the track width direction (in the X direction in the drawing) by a longitudinal magnetic field from the hard bias layers 35.

The bias underlayers 37 are composed of Cr, W, or Ti, and the hard bias underlayers 38 is composed of, for example, a Co—Pt alloy or Co—Cr—Pt alloy. The electrode layers 39 are composed of Cr, Ta, Rh, Au, W, or the like.

The thickness of the bias underlayer 37 is 20 to 100 Å. The thickness of the hard bias layer 38 is 100 to 400 Å. The thickness of the electrode layer 39 is 400 to 1,500 Å.

An upper gap layer 40 composed of an insulating material, such as alumina, is disposed over the electrode layers 39 and the protective layer 36. Although not shown in the drawing, a lower shielding layer is disposed under the lower gap layer 30, and an upper shielding layer is disposed on the upper gap layer 40. Each of the lower shielding layer and the upper shielding layer is composed of a soft magnetic material, such as NiFe. The thickness of each of the upper gap layer 40 and the lower gap layer 30 is 50 to 300 Å.

The magnetization of the free magnetic layer 35 is aligned in the track width direction (in the X direction in the drawing) by a longitudinal magnetic field from the hard bias layers 38. The magnetization of the free magnetic layer 35 is sensitively changed in response to a signal magnetic field (external magnetic field) from the recording medium. On the other hand, the magnetization of the pinned magnetic layer 33 is pinned in the height direction (in the Y direction in the drawing).

The electrical resistance changes depending on the relationship between the change in the magnetization direction of the free magnetic field 35 and the pinned magnetization direction of the pinned magnetic layer 33 (in particular, the pinned magnetization direction of the second magnetic sublayer 33c). The leakage magnetic field from the recording medium is detected because of a change in voltage or current based on the change in the electrical resistance.

The pinned magnetic layer 33 of the magnetic sensing element shown in FIG. 5 has a synthetic ferrimagnetic structure including the first magnetic sublayer 33a and the second magnetic sublayer 33c separated by the nonmagnetic intermediate sublayer 33b. The first magnetic sublayer 33a and the second magnetic sublayer 33c are magnetized antiparallel to each other due to the RKKY interaction via the nonmagnetic intermediate sublayer 33b.

The first magnetic sublayer 33a is placed further away from the nonmagnetic layer 34 compared to the second magnetic sublayer 33c, and is in contact with the nonmagnetic metal layer 32.

The nonmagnetic metal layer 32 is composed of a PtMn alloy or X—Mn alloy, wherein X is at least one element selected from the group consisting of Pt, Pd. Ir, Rh, Ru, Os, Ni, and Fe.

The thickness of the nonmagnetic metal layer 32 is preferably 5 to 50 Å. If the nonmagnetic metal layer 32 composed of the PtMn alloy or X—Mn alloy, wherein X is at least one element selected from the group consisting of Pt, Pd, Ir, Rh, Ru, Os, Ni, and Fe, has a thickness in the range described above, the nonmagnetic metal layer 32 maintains the face-centered cubic (fcc) crystal structure which is the state as-deposited. If the thickness of the nonmagnetic metal layer 32 is larger than 50 Å and smaller than 80 Å, the crystal structure is transformed into a CuAuI-type ordered face-centered tetragonal (fct) structure when annealed at 250° C. or more, and thus antiferromagnetism is exhibited. This is not advantageous because heat resistance is degraded. However, even if the thickness of the nonmagnetic metal layer 32 is larger than 50 Å, if a heat of 250° C. or more is not applied, the nonmagnetic metal layer 32 maintains the face-centered cubic (fcc) crystal structure which is the state as-deposited.

When the nonmagnetic metal layer 32 composed of the PtMn alloy or X—Mn alloy, wherein X is at least one element selected from the group consisting of Pt, Pd, Ir, Rh, Ru, Os, Ni, and Fe, has the face-centered cubic (fcc) crystal structure, an exchange coupling magnetic field is not generated at the interface between the nonmagnetic metal layer 32 and the first magnetic sublayer 33a, or the exchange coupling magnetic field is extremely weak even if generated. Thereby, it is not possible to pin the magnetization of the first magnetic sublayer 33a by the exchange coupling magnetic field.

Consequently, in the magnetic sensing element shown in FIG. 5, the magnetization of the pinned magnetic layer 33 is pinned by the uniaxial magnetic anisotropy of the pinned magnetic layer 33 itself. Such a magnetic sensing element is referred to as a self-pinned magnetic sensing element.

In the self-pinned magnetic sensing element, the shunt loss can be decreased compared with the magnetic sensing element including a thick antiferromagnetic layer with a thickness of about 200 Å. Therefore, the magnetic field detection output of the magnetic sensing element can be improved by 20% to 30%. Furthermore, since the distance between the upper and lower shielding layers in the magnetic sensing element can be decreased, such a magnetic sensing element can also meet further increases in linear recording density of recording media.

In this embodiment, the thickness of the second magnetic sublayer 33c is larger than the thickness of the first magnetic sublayer 33a. The magnetization of the second magnetic sublayer 33c is directed in the height direction (in the Y direction), and the magnetization of the first magnetic sublayer 33a is pinned antiparallel to the height direction.

The thickness of the first magnetic sublayer 33a is 10 to 30 Å, and the thickness of the second magnetic sublayer 33c is 15 to 35 Å. As the thickness of the first magnetic sublayer 33a increases, the coercive force increases. However, if the thickness of the first magnetic sublayer 33a increases, the shunt loss increases. As will be described below, when the first magnetic layer 33a is aligned with the nonmagnetic metal layer 32, strain occurs in the crystal structure, and this strain increases the magnetostriction constant λ and the uniaxial magnetic anisotropy.

The uniaxial magnetic anisotropy which pins the magnetization of the pinned magnetic layer 33 depends on induced magnetic anisotropy and magnetoelastic effect. The present invention mainly uses the magnetoelastic effect.

The magnetoelastic effect is controlled by magnetoelastic energy. The magnetoelastic energy is defined by the stress σ applied to the pinned magnetic layer 33 and the magnetostriction constant λ of the pinned magnetic layer 33.

Figure 6:
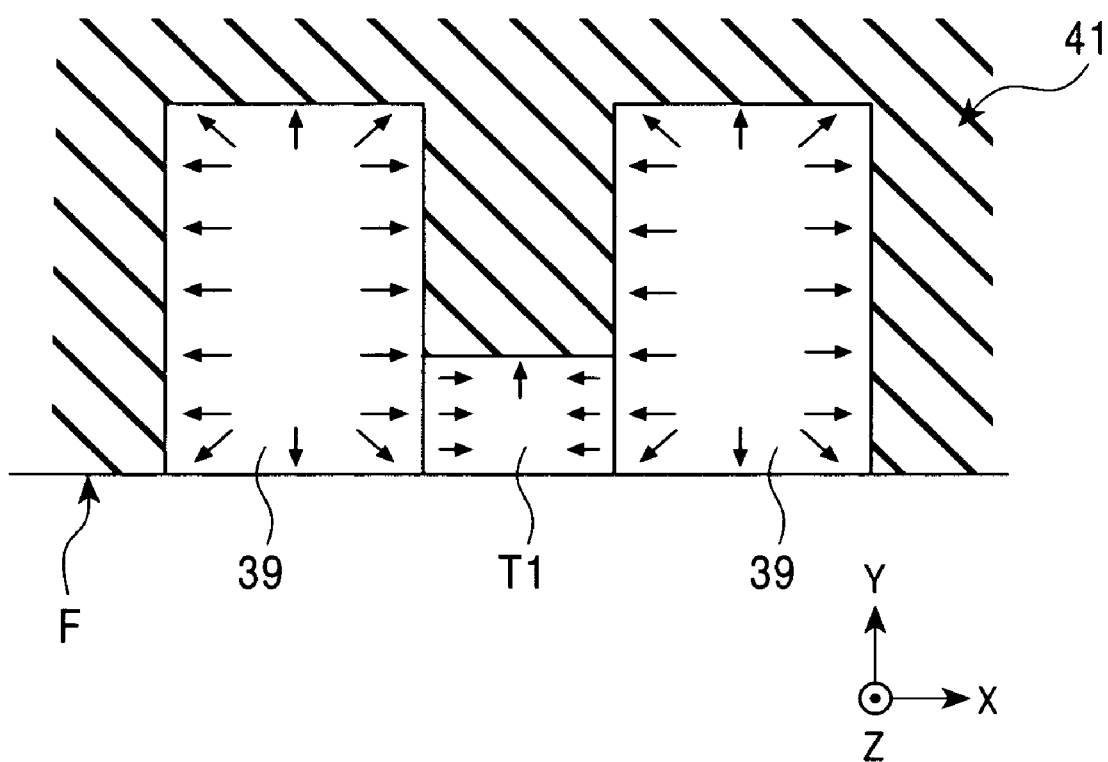
FIG. 6 is a plan view of the magnetic sensing element in the fifth embodiment of the present invention.

FIG. 6 is a plan view of the magnetic sensing element shown in FIG. 5, viewed from above (from a direction opposite to the Z direction in the drawing). The laminate T1 of the magnetic sensing element is disposed between the pairs of bias underlayers 37, hard bias layers 38, and electrode layers 39. Since the bias underlayers 37 and the hard bias layers 38 are disposed under the electrode layers 39, they are not shown in FIG. 6. The periphery of the laminate T1, the bias underlayers 37, the hard bias layers 38, and the electrode layers 39 are filled with an insulating layer 41 indicated by oblique lines in FIG. 6.

An end face F, which faces the recording medium, of the laminate T1, the bias underlayers 37, the hard bias layers 38, and the electrode layers 39 is either exposed or simply covered with a thin protective layer composed of diamond-like carbon (DLC) or the like with a thickness of 20 to 50 Å. That is, the end face F is an open end.

Consequently, since the originally two-dimensionally isotropic stresses from the lower gap layer 30 and the upper gap layer 40 are released at the end face F, the symmetry is lost, and as a result, tensile stresses are applied parallel to the height direction (the Y direction). When the laminate including the bias underlayers 37, the hard bias layers 38, and the electrode layers 39 has compressive internal stresses, since the electrode layers 39, etc., are apt to stretch in the in-plane direction, compressive stresses are applied to the laminate T1 in directions parallel and antiparallel to the track width direction (the X direction).

That is, the tensile stresses in the height direction and the compressive stresses in the track width direction are applied to the pinned magnetic layer 33 which is opened at the end face F facing the recording medium. Since the first magnetic sublayer 33a is composed of a magnetic material having a positive magnetostriction constant, the easy magnetization axis of the first magnetic sublayer 33a is directed toward the back, i.e., parallel to the height direction (the Y direction), and the magnetization of the first magnetic sublayer 33a is pinned parallel or antiparallel to the height direction. The magnetization of the second magnetic sublayer 33c is pinned antiparallel to the magnetization direction of the first magnetic sublayer 33a by the RKKY interaction via the nonmagnetic intermediate sublayer 33b.

In the present invention, by increasing the magnetostriction constant of the pinned magnetic layer 33, the magnetoelastic energy is increased, and thereby the uniaxial magnetic anisotropy of the pinned magnetic layer 33 is increased. If the uniaxial magnetic anisotropy of the pinned magnetic layer 33 is increased, the magnetization of the pinned magnetic layer 33 is strongly pinned in a certain direction, resulting in an increase in the output of the magnetic sensing element and improvements in stability in the output and symmetry.

Specifically, by joining the first magnetic sublayer 33a constituting the pinned magnetic layer 33 with the nonmagnetic metal layer 32, strain is caused in the crystal structure of the first magnetic sublayer 33a so that the magnetostriction constant λ of the first magnetic sublayer 33a is increased.

As described above, the nonmagnetic metal layer 32 has the fcc structure and the equivalent crystal plane represented as {111} plane is preferentially oriented parallel to the interface.

On the other hand, when the first magnetic sublayer 33a of the pinned magnetic layer 33 is composed of Co or $Co_xFe_y$, wherein y≦20, and x+Y=100, the first magnetic sublayer 33a has a face-centered cubic (fcc) structure. In the first magnetic sublayer 33a, the equivalent crystal plane represented as {111} plane is preferentially oriented parallel to the interface.

Consequently, the atoms constituting the first magnetic sublayer 33a and the atoms constituting the nonmagnetic metal layer 32 are easily matched with each other, and the crystals in the nonmagnetic metal layer 32 and the crystals in the pinned magnetic layer 33 are in the epitaxial state.

However, there must be a certain difference or more between the nearest atom spacing in the {111} plane of the first magnetic sublayer 33a and the nearest atom spacing in the {111} plane of the nonmagnetic metal layer 32.

In order to increase the magnetostriction of the first magnetic sublayer 33a by causing strain in the crystal structure while allowing the atoms constituting the nonmagnetic metal layer 32 and the atoms constituting the first magnetic sublayer 33a to be substantially matched with each other, preferably, the Pt content in the PtMn alloy or the X content in the X—Mn alloy which constitutes the nonmagnetic metal layer 32 is adjusted.

For example, if the Pt content in the PtMn alloy or the X content in the X—Mn alloy is set at 51 atomic percent or more, the magnetostriction of the first magnetic sublayer 33a which overlies the nonmagnetic metal layer 32 is rapidly increased. Alternatively, if the X content in the X—Mn alloy is set in the range of 55 to 99 atomic percent, the magnetostriction of the first magnetic sublayer 33a becomes stable at a large value.

Preferably, the value obtained by dividing the difference between the nearest atom spacing in the {111} plane of the nonmagnetic metal layer 32 and the nearest atom spacing in the {111} plane of the first magnetic sublayer 33a by the nearest atom spacing in the {111} plane of the first magnetic sublayer 33a (hereinafter referred to as the mismatch value) is set at 0.05 to 0.20.

In the magnetic sensing element in this embodiment, while the atoms constituting the nonmagnetic metal layer 32 and the atoms constituting the first magnetic sublayer 33a are substantially matched with each other, strain occurs in the crystal structures in the vicinity of the interface.

Alternatively, the first magnetic sublayer 33a of the pinned magnetic layer 33 may have a body-centered cubic (bcc) structure and the equivalent crystal plane represented as {110} plane is preferentially oriented parallel to the interface.

For example, when the first magnetic sublayer 33a of the pinned magnetic layer 33 is composed of $Co_xFe_y$, wherein $y \geq 20$, and $x+y=100$, the first magnetic sublayer 33a has a body-centered cubic (bcc) structure.

As described above, the nonmagnetic metal layer 32 has the fcc structure and the equivalent crystal plane represented as {111} plane is preferentially oriented parallel to the interface.

The atomic arrangement in the equivalent crystal plane represented as {110} plane of crystals having the bcc structure is similar to the atomic arrangement in the equivalent crystal plane represented as {111} plane of crystals having the fcc structure. It is possible to arrange the crystals having the bcc structure and the crystals having the fcc structure so as to have a coherent state in which the individual atoms are matched with each other, i.e., a so-called heteroepitaxial state.

Furthermore, there is a certain difference or more between the nearest atom spacing in the {110} plane of the first magnetic sublayer 33a and the nearest atom spacing in the {111} plane of the nonmagnetic metal layer 32. Therefore, in the vicinity of the interface between the first magnetic sublayer 33a and the nonmagnetic metal layer 32, while the atoms constituting the first magnetic sublayer 33a and the atoms constituting the nonmagnetic metal layer 32 are substantially matched with each other, strain occurs in the individual crystal structures. Consequently, by causing the strain in the crystal structure of the first magnetic sublayer 33a, the magnetostriction constant λ can be increased.

Additionally, the $Co_xFe_y$ alloy, wherein $y \geq 20$, and $x+y=100$, having the bcc structure has a larger magnetostriction constant λ than the $Co_xFe_y$ alloy, wherein $y \leq 20$, and $x+Y=100$, having the fcc structure. Therefore, a larger magnetoelastic effect can be exhibited. Furthermore, the $Co_xFe_y$ alloy, wherein $y \geq 20$, and $x+y=100$, having the bcc structure has a large coercive force, and thereby the magnetization of the pinned magnetic layer 33 can be strongly pinned.

In the present invention, at the vicinity of the interface between the first magnetic sublayer 33a and the nonmagnetic metal layer 32, most of the atoms constituting the first magnetic sublayer 33a and most of the atoms constituting the nonmagnetic metal layer 32 must be matched with each other, i.e. in the coherent state. For example, there may be regions in which the atoms constituting the first pinned magnetic sublayer 33a and the atoms constituting the nonmagnetic metal layer 32 are not matched with each other.

As the material for the second pinned magnetic sublayer 33c, either the $Co_xFe_y$ alloy, wherein $y \geq 20$, and $x+y=100$, having the bcc structure or the $Co_xFe_y$ alloy, wherein $y \geq 20$, and $x+Y=100$, having the fcc structure may be used.

If the $Co_xFe_y$ alloy, wherein $y \geq 20$, and $x+y=100$, having the bcc structure is used for the second magnetic sublayer 33c, the positive magnetostriction can be increased. Furthermore, the $Co_xFe_y$ alloy, wherein $y \geq 20$, and $x+y=100$, having the bcc structure has a large coercive force, and thereby the magnetization of the pinned magnetic layer 33 can be pinned strongly. The RKKY interaction between the first magnetic sublayer 33a and the second magnetic sublayer 33c via the nonmagnetic intermediate sublayer 33b can also be increased.

On the other hand, since the second magnetic sublayer 33c, which is in contact with the nonmagnetic layer 34, greatly affects the magnetoresistance effect, if the second magnetic sublayer 33c is composed of Co or $Co_xFe_y$, wherein $y \leq 20$, and $x+Y=100$, having the fcc structure, a degradation in the magnetoresistance effect is decreased.

The seed layer 31 is used in order to improve the {111} orientation of the nonmagnetic metal layer 32.

In this embodiment, it is also possible to set the thickness of the seed layer 31 composed of a $(Ni_{0.8}Fe_{0.2})_{60}Cr_{40}$ alloy so as to be smaller than or equal to the critical thickness, i.e., 38 Å, for example, at 20 Å.

Although the seed layer 31 has a thickness that is smaller than or equal to the critical thickness, i.e., 38 Å, the seed layer 31 has a crystalline phase which extends through from the upper surface to the lower surface of the seed layer 31, and moreover, the average crystal grain size, in a direction parallel to the layer surface, of the crystal grains in the seed layer 31 is larger than the thickness of the seed layer 31. The average crystal grain size of the seed layer can be set at about 80 to 120 Å.

Even if the total thickness and the shunt loss of the magnetic sensing element are decreased by setting the thickness of the seed layer 31 so as to be smaller than the critical thickness, the uniaxial magnetic anisotropy based on the magnetoelastic effect of the pinned magnetic layer 33 is increased, and the magnetization of the pinned magnetic layer 33 is strongly pinned in a predetermined direction. Thereby, a larger change in resistance ΔRs and a higher rate of change in resistance ΔRs/Rs can be maintained.

The magnetic sensing element of the present invention described above can be fabricated by the method described below.

First, a seed layer 22 is formed at a thickness that is larger than the critical thickness of the seed layer 22. Next, by etching the upper surface of the seed layer 22, the seed layer 22 with a thickness that is smaller than or equal to the critical thickness is formed.

In the step of etching the upper surface of the seed layer 22, plasma etching (inverse sputtering), reactive ion etching, or ion beam etching may be used. In the ion beam etching process, the layer surface can be processed more smoothly compared with the other processes and superior reproducibility can be achieved.

When the seed layer 22 is composed of the $(Ni_{0.8}Fe_{0.2})_{60}Cr_{40}$ alloy, the critical thickness is 38 Å. For example, after the seed layer 22 is formed at a thickness of 42 Å, the thickness is decreased to 22 Å by etching the upper surface of the seed layer 22.

Furthermore, an antiferromagnetic layer, a pinned magnetic layer, a nonmagnetic layer, and a free magnetic layer are deposited on the seed layer 22.

By forming the seed layer 22 at a thickness that is larger than the critical thickness first, it is possible to form a crystalline phase including crystal grains which extend through from the upper surface to the lower surface of the seed layer 22. Once the crystalline phase including the crystal grains which extend through from the upper surface to the lower surface of the seed layer 22 is formed, even if the seed layer 22 is etched so that the thickness is smaller than or equal to the critical thickness, the shape of the columnar grains which extend through from the upper surface to the lower surface is maintained.

Furthermore, if the seed layer 22 is formed at a thickness that is larger than the critical thickness, the crystal grain size of the crystals formed in the seed layer 22 is sufficiently increased. After the formation, even if the seed layer 22 is etched to decrease the thickness to be equal to or smaller than the critical thickness, the crystal grain size of the crystals formed in the seed layer 22 is maintained.

Consequently, by using the method for fabricating the exchange-coupled film of the present invention, even if the thickness of the seed layer 22 is set to be smaller than the critical thickness, the average crystal grain size, in a direction parallel to the layer surface, of the crystal grains in the seed layer 22 can be set to be larger than the thickness of the seed layer 22, i.e., 22 Å.

Therefore, by using the fabrication method of the present invention, even if the thickness of the seed layer 22 is set to be smaller than the critical thickness, it is possible to generate a strong exchange coupling magnetic field Hex at the interface between the antiferromagnetic layer and the pinned magnetic layer.

Additionally, the seed layer 22 has a face-centered cubic (fcc) structure and a crystalline phase in which the equivalent crystal plane represented as {111} plane is preferentially oriented parallel to the interface.

If the seed layer 22 or 31 is composed of a NiCr alloy or NiFeCr alloy with a Cr content of 40 to 60 atomic percent, the critical thickness becomes larger than 38 Å. In the present invention, it is possible to set the thickness of the seed layer 22 or 31 to be smaller than or equal to the critical thickness by etching the seed layer 22 or 31 so that the thickness thereof is larger than 0 Å and smaller than or equal to 38 Å.

Furthermore, if the seed layer 22 or 31 is composed of a NiCr alloy or NiFeCr alloy with a Cr content of 35 to 60 atomic percent, the critical thickness becomes larger than 30 Å. In the present invention, it is possible to set the thickness of the seed layer 22 or 31 to be smaller than or equal to the critical thickness by etching the seed layer 22 or 31 so that the thickness thereof is larger than 0 Å and smaller than or equal to 30 Å.

The thickness of the seed layer 22 is preferably 6 Å or more, and more preferably 12 Å or more.

Additionally, if the Cr content in the NiCr alloy or NiFeCr alloy is increased, the critical thickness increases, and the initial thickness of the film must be increased. Therefore, the Cr content in the NiCr alloy or NiFeCr alloy is preferably 50 atomic percent or less.

Figure 7:
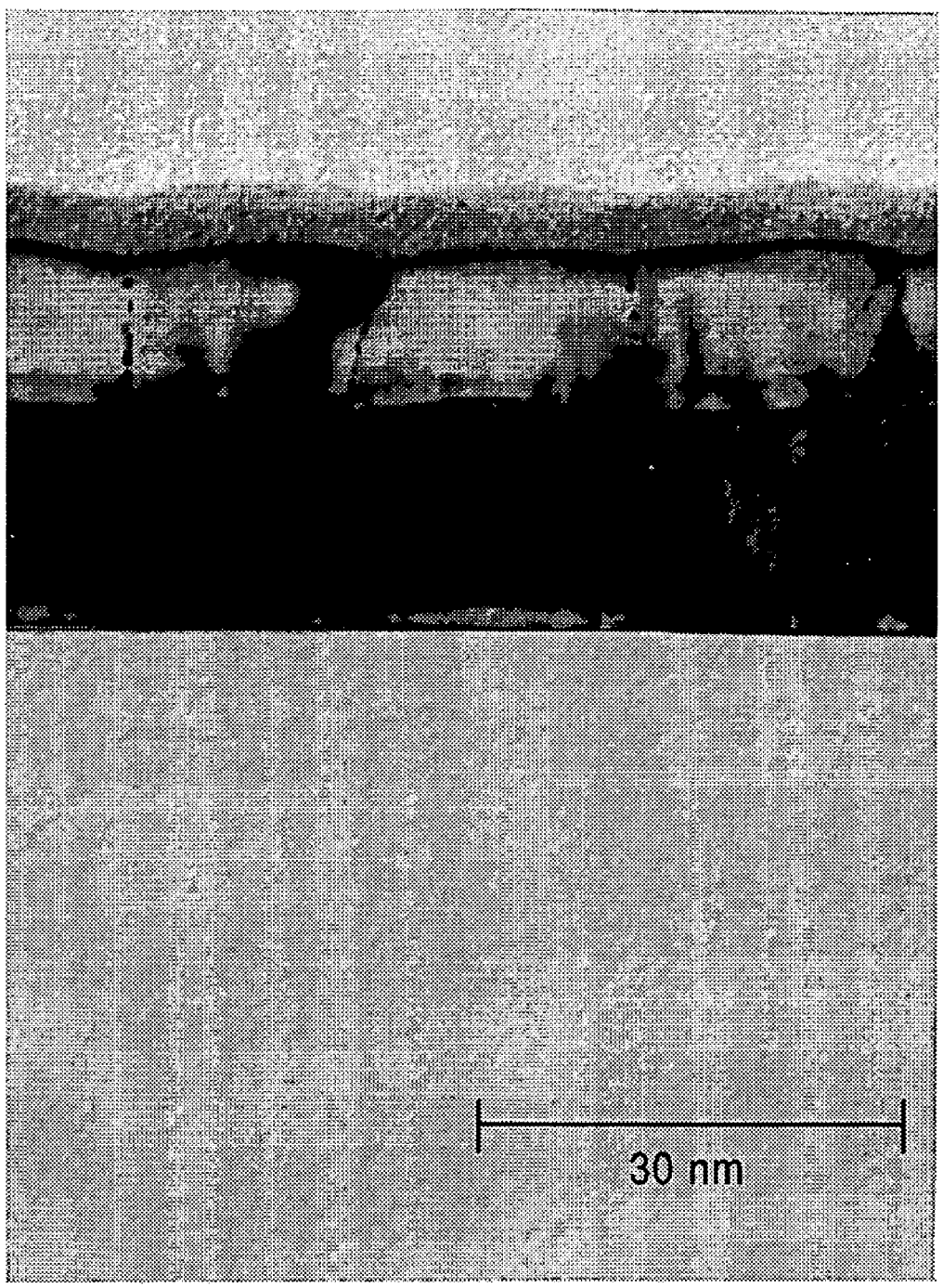
FIG. 7 is a transmission electron micrograph of a magnetic sensing element of the present invention.
Figure 8:
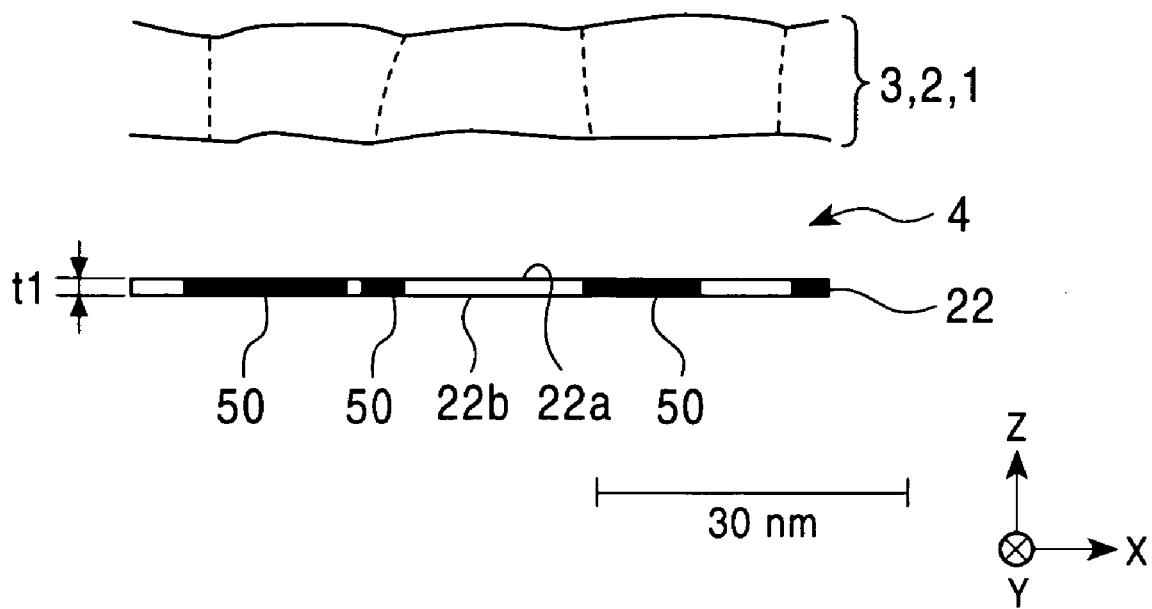
FIG. 8 is a schematic diagram of the transmission electron micrograph of the magnetic sensing element of the present invention shown in FIG. 7.

FIG. 7 is a transmission electron micrograph of a magnetic sensing element of the present invention including an antiferromagnetic layer 4 (PtMn)/pinned magnetic layer 3 (CoFe/Ru/CoFe)/nonmagnetic layer 2 (Cu)/free magnetic layer 1 (CoFe/NiFe)/protective layer 7 (Ta (30 Å)) deposited on a seed layer 22 (NiFeCr). FIG. 8 is a schematic diagram of the transmission electron micrograph shown in FIG. 7.

Herein, the seed layer 22 is composed of a $(Ni_{0.8}Fe_{0.2})_{60}Cr_{40}$ alloy. After the seed layer 22 is formed at a thickness of 42 Å, the surface of the seed layer is etched so that the thickness is 22 Å. Inverse sputtering, plasma etching, ion beam etching, or reactive ion etching may be used to etch the seed layer 22.

Furthermore, the antiferromagnetic layer 4, the pinned magnetic layer 3, the nonmagnetic layer 2, the free magnetic layer 1, and the protective layer 7 are continuously formed on the seed layer 22 by sputtering. As shown in FIG. 7, the seed layer 22 has a crystalline phase including columnar grains 50 which extend through from an upper surface 22a to a lower surface 22b.

The average crystal grain size, in a direction parallel to the layer surface, of the crystal grains in the seed layer 22 is 113 Å, which is larger than the thickness t1 of the seed layer 22, i.e., 22 Å.

The crystalline phase (columnar grains 50) of the seed layer 22 has a face-centered cubic (fcc) structure and the equivalent crystal plane represented as {111} plane is preferentially oriented parallel to the layer surface.

In each of the pinned magnetic layer 3, the nonmagnetic layer 2, and the free magnetic layer 1, the equivalent crystal plane represented as {111} plane is also preferentially oriented parallel to the layer surface.

In this embodiment, although the thickness of the seed layer is smaller than or equal to the critical thickness (38 Å), it is possible to align the crystal orientations of the antiferromagnetic layer, the pinned magnetic layer, the nonmagnetic layer, and the free magnetic layer. Furthermore, since it is possible to decrease the shunt of the sensing current, the rate of change in resistance ΔR/R can be improved.

Figure 9:
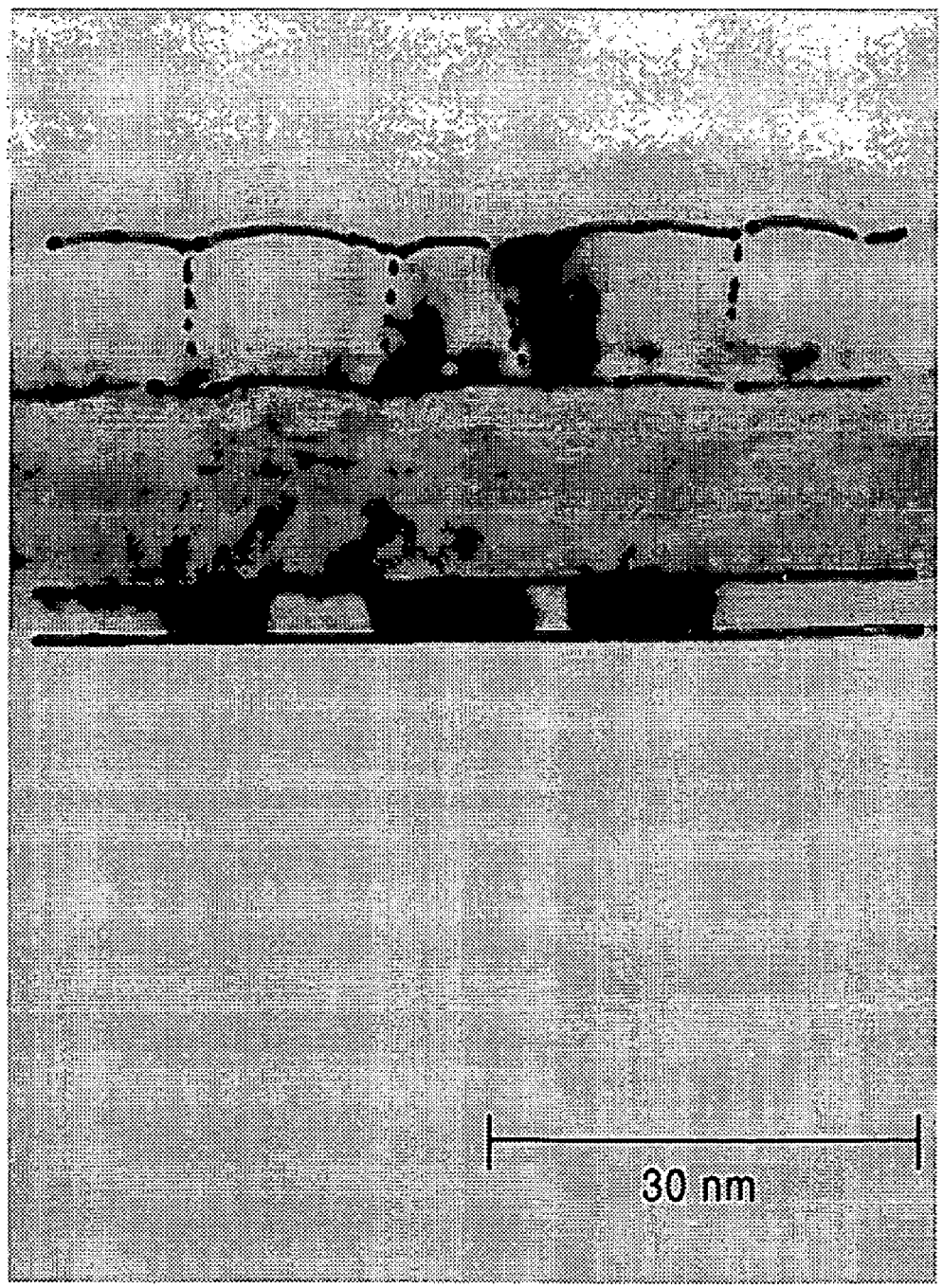
FIG. 9 is a transmission electron micrograph of a conventional magnetic sensing element.
Figure 10:
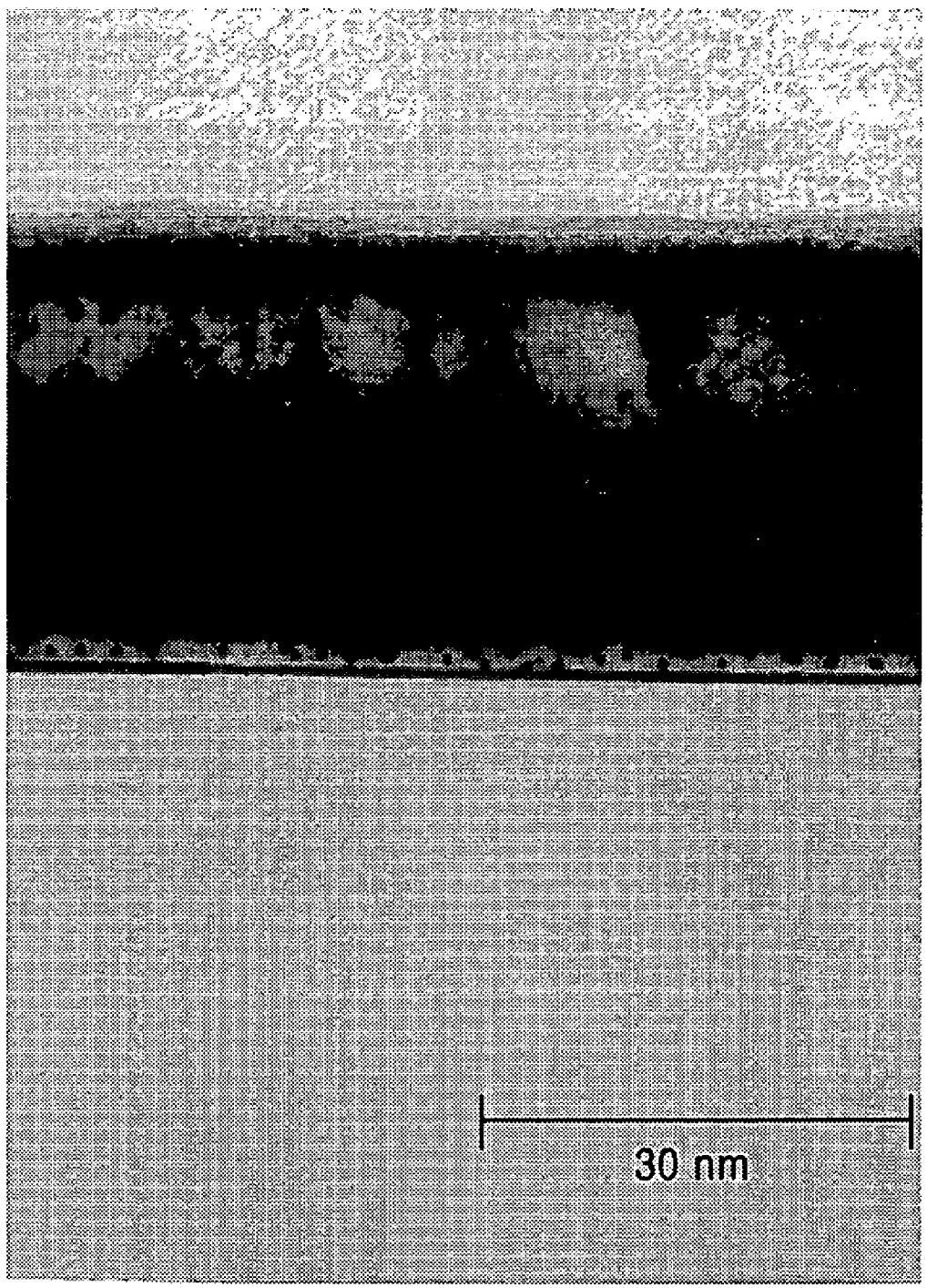
FIG. 10 is a transmission electron micrograph of a conventional magnetic sensing element.
Figure 11:
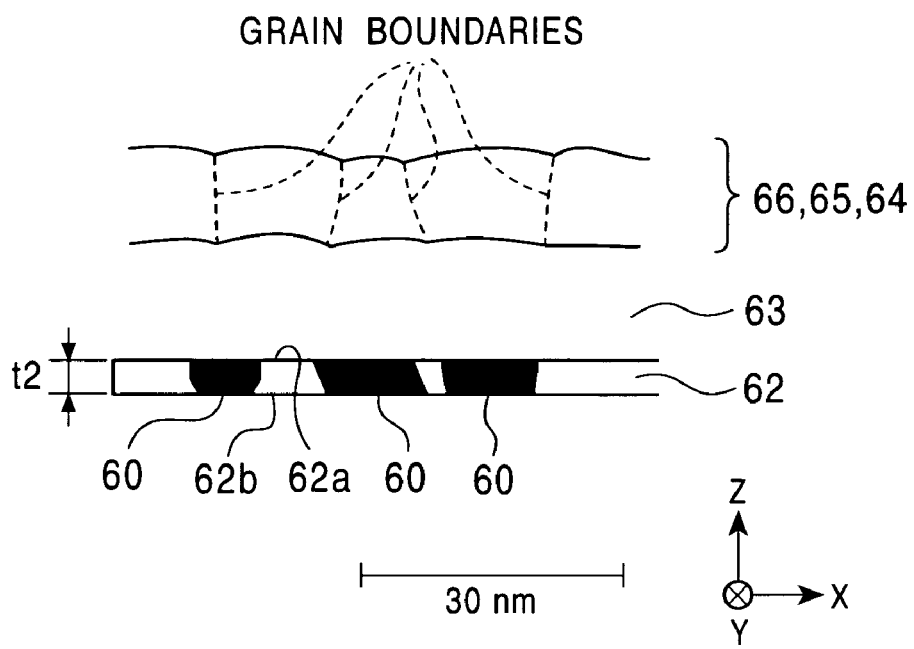
FIG. 11 is a schematic diagram of the transmission electron micrograph of the conventional magnetic sensing element shown in FIG. 9.
Figure 12:
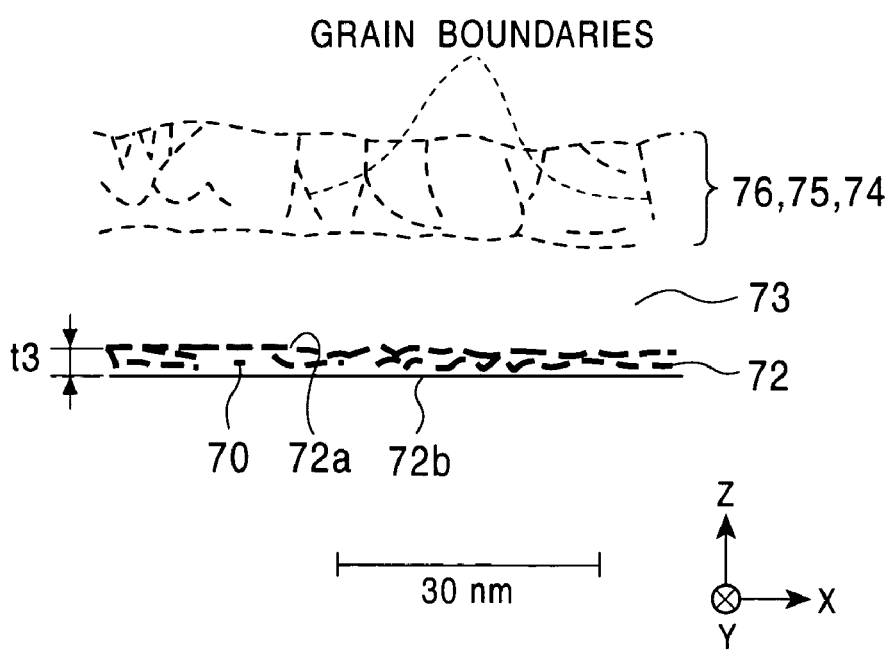
FIG. 12 is a schematic diagram of the transmission electron micrograph of the conventional magnetic sensing element shown in FIG. 10.

For comparison, a transmission electron micrograph of a magnetic sensing element is shown in each of FIGS. 9 and 10. The magnetic sensing element includes antiferromagnetic layer (PtMn)/pinned magnetic layer (CoFe/Ru/CoFe)/nonmagnetic layer (Cu)/free magnetic layer (CoFe/NiFe)/protective layer (Ta (30 Å)) deposited on a conventional seed layer (NiFeCr). FIG. 11 is a schematic diagram of the transmission electron micrograph of FIG. 9, and FIG. 12 is a schematic diagram of the transmission electron micrograph of FIG. 10.

In the magnetic sensing element shown in FIG. 11, after a seed layer 62 is formed using a $(Ni_{0.8}Fe_{0.2})_{60}Cr_{40}$ alloy by sputtering at a thickness t2, an antiferromagnetic layer 63, a pinned magnetic layer 64, a nonmagnetic layer 65, a free magnetic layer 66, and a protective layer 67 were continuously deposited.

As shown in FIG. 11, since the seed layer 62 (NiFeCr) is formed at a thickness that is larger than the critical thickness, i.e., 38 Å, the seed layer 62 has a crystalline phase including columnar grains 60 which extend through from an upper surface 62a to a lower surface 62b.

The crystalline phase (columnar grains 60) of the seed layer 62 has a face-centered cubic (fcc) structure and the equivalent crystal plane represented as {111} plane is preferentially oriented parallel to the layer surface.

In each of the pinned magnetic layer 64, the nonmagnetic layer 65, and the free magnetic layer 66, the equivalent crystal plane represented as {111} plane is also preferentially oriented parallel to the layer surface.

In the magnetic sensing element shown in FIG. 12, after a seed layer 72 is formed using a $(Ni_{0.8}Fe_{0.2})_{60}Cr_{40}$ alloy by sputtering at a thickness t3 of 32 Å, an antiferromagnetic layer 73, a pinned magnetic layer 74, a nonmagnetic layer 75, a free magnetic layer 76, and a protective layer were continuously deposited.

Since the seed layer 72 (NiFeCr) is formed at a thickness that is smaller than the critical thickness, i.e., 38 Å, the crystal grain size of the crystal grains generated in the seed layer 72 is small, and columnar grains which extend through from an upper surface 72a to a lower surface 72b are not formed in the crystalline phase of the seed layer 72.

The average crystal grain size, in a direction parallel to the layer surface, of the crystal grains 70 in the seed layer 72 is 20 Å which is smaller than the thickness t3 of the seed layer 72, i.e., 32 Å.

In each of the pinned magnetic layer 74, the nonmagnetic layer 75, and the free magnetic layer 76, the equivalent crystal plane represented as {111} plane is not oriented in a certain direction.

In the laminate constituting the magnetic sensing element shown in FIG. 12, the unidirectional exchange bias magnetic field Hex* is small at about $8.8 \times 10^4$ A/m, and the rate of change in magnetoresistance ΔRs/Rs is 8% or less. The laminate shown in FIG. 12 thus has inferior performance compared to the laminate constituting the magnetic sensing element of the present invention.

Additionally, as in the present invention, when the surface of the seed layer 22 is etched, the Cr concentration at the outermost surface of the finished seed layer 22 may be slightly lower than the Cr concentration inside the seed layer 22 and the Ni concentration at the outermost surface of the finished seed layer 22 may be slightly higher than the Ni concentration inside the seed layer 22. If such a concentration gradient occurs, it is believed that the surface energy of the seed layer 22 changes and the surface of the seed layer 22 improves, resulting in an increase in the exchange coupling magnetic field Hex between the antiferromagnetic layer 4 and the pinned magnetic layer 3. This concentration gradient is caused by the step of etching the surface of the seed layer 22 and does not occur in the conventional seed layer.

EXAMPLES

Magnetic sensing elements were fabricated for testing. In order to fabricate each magnetic sensing element, a seed layer was formed using a $(Ni_{0.8}Fe_{0.2})_{60}Cr_{40}$ alloy at a thickness of 42 Å by sputtering, and the upper surface of the seed layer was etched so that the thickness of the seed layer was smaller than or equal to the critical thickness, i.e., 38 Å. Plasma etching (inverse sputtering) or ion beam etching was used to etch the seed layer. Furthermore, a structure of antiferromagnetic layer [PtMn (140 Å)]/pinned magnetic layer [CoFe (16 Å)/Ru (8.7 Å)/CoFe (22 Å)]/nonmagnetic layer [Cu (19 Å)]/free magnetic layer [CoFe (10 Å)/NiFe (35 Å)]/protective layer [Ta (30 Å)] was continuously formed by sputtering on the seed layer.

By changing the amount removed from the seed layer, magnetic sensing elements having seed layers with different thicknesses were prepared. The rate of change in resistance ΔRs/Rs, the change in resistance ΔRs, the sheet resistance Rs, and the unidirectional exchange bias magnetic field Hex* were measured.

Figure 13:
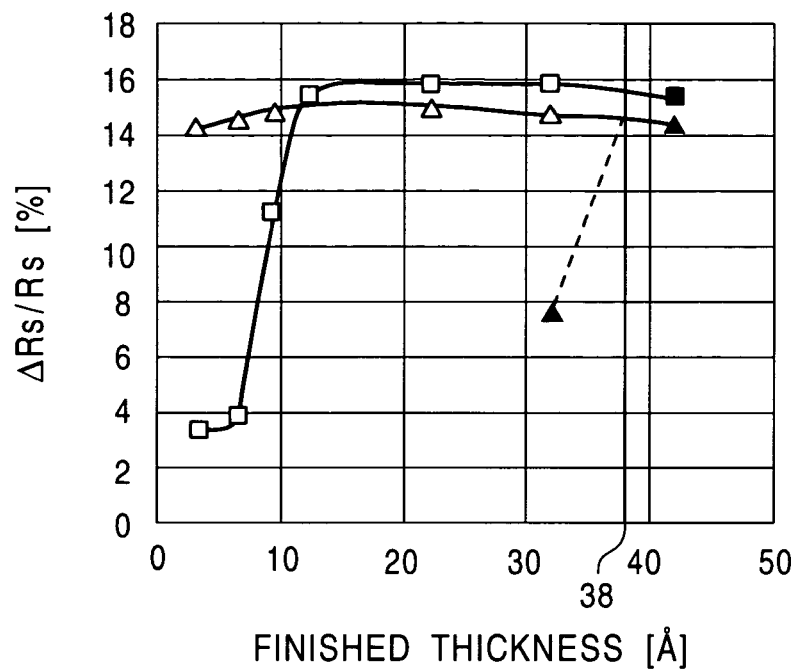
FIG. 13 is a graph which shows the relationships between the thickness of finished seed layers and the rate of change in resistance in the magnetic sensing element of the present invention and the conventional magnetic sensing element.
Figure 14:
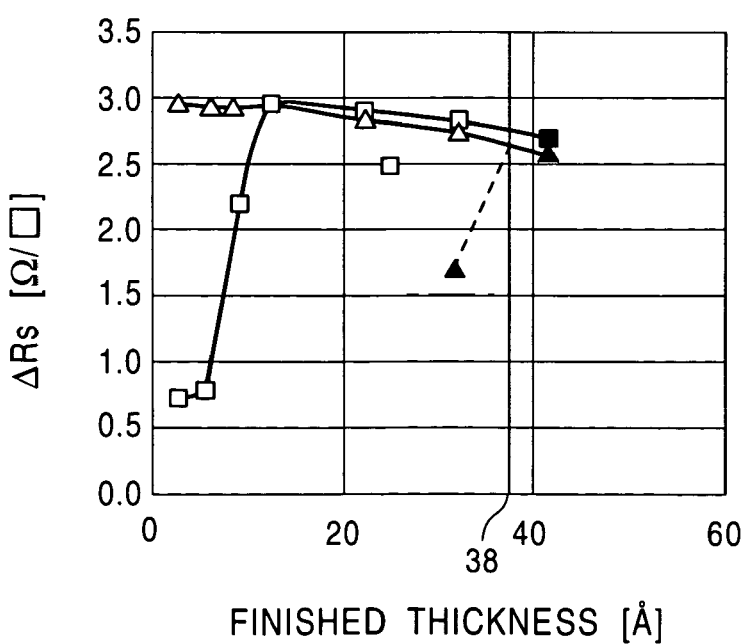
FIG. 14 is a graph which shows the relationships between the thickness of finished seed layers and the change in sheet resistance in the magnetic sensing element of the present invention and the conventional magnetic sensing element.
Figure 15:
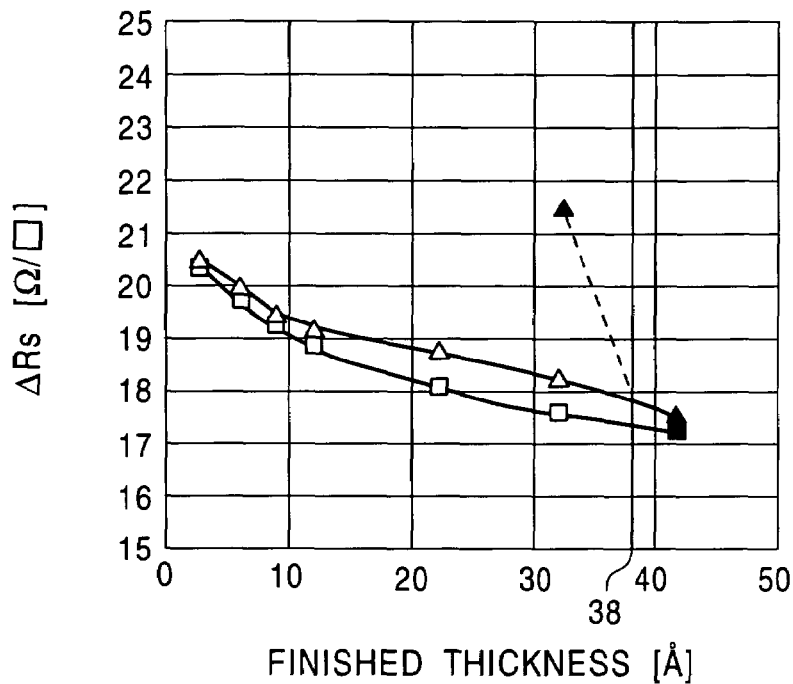
FIG. 15 is a graph which shows the relationships between the thickness of finished seed layers and the sheet resistance in the magnetic sensing element of the present invention and the conventional magnetic sensing element.
Figure 16:
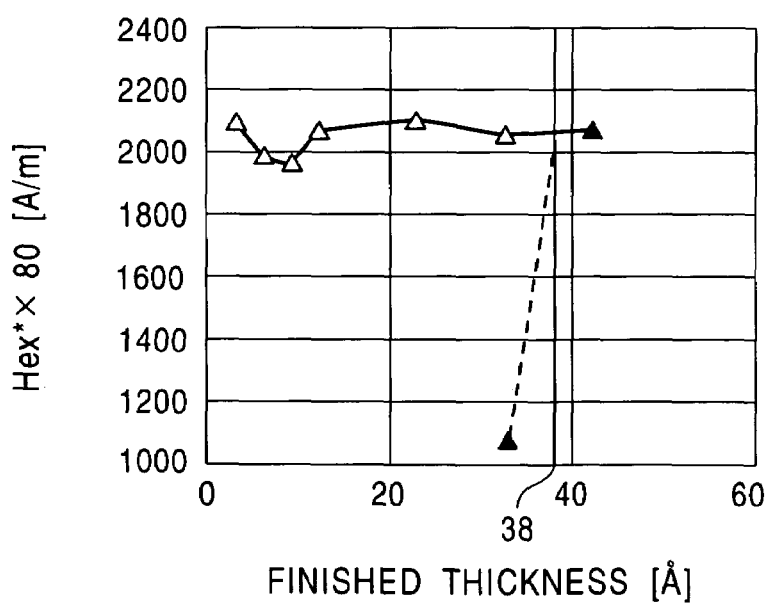
FIG. 16 is a graph which shows the relationships between the thickness of finished seed layers and the unidirectional exchange bias magnetic field (Hex*) in the magnetic sensing element of the present invention and the conventional magnetic sensing element.

The results thereof are shown by delta (Δ) in the graphs of FIGS. 13 to 16. FIG. 13 is a graph which shows the measurement results of the rate of change in resistance ΔRs/Rs. FIG. 14 is a graph which shows the measurement results of the change in resistance ΔRs. FIG. 15 is a graph which shows the measurement results of the sheet resistance Rs. FIG. 16 is a graph which shows the measurement results of the unidirectional exchange bias magnetic field Hex*.

For comparison, the graphs of FIGS. 28 to 31, which have been described above with reference to the conventional magnetic sensing elements, are also shown by dotted lines in FIGS. 13 to 16, respectively.

When the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness in accordance with the present invention, as shown in FIG. 13, as the thickness (finished thickness) of the seed layer after the etching step decreases, the rate of change in resistance ΔRs/Rs increases.

As shown in FIG. 13, even if the finished thickness of the seed layer is smaller than or equal to the critical thickness of 38 Å, a rate of change in resistance ΔRs/Rs of 14% or more can be achieved. In particular, when the finished thickness of the seed layer is in a range of 9 to 22 Å, a rate of change in resistance ΔRs/Rs of 15% or more can be achieved.

The rate of change in resistance ΔRs/Rs increases as the finished thickness of the seed layer decreases because it is believed that the shunt loss due to the flow of the sensing current into the seed layer decreases.

If the finished thickness of the seed layer becomes smaller than 12 Å, the rate of change in resistance ΔRs/Rs gradually decreases. However, if the finished thickness of the seed layer is 3 Å or more, a rate of change in resistance ΔRs/Rs of 14% or more can be achieved.

As shown in FIG. 14, when the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness, as the thickness (finished thickness) of the seed layer after the etching step decreases, the change in resistance ΔRs increases.

As is evident from FIG. 14, when the finished thickness of the seed layer is 42 Å, the change in resistance ΔRs is 2.55 ohms per square. When the finished thickness of the seed layer is 22 Å, the change in resistance ΔRs is 2.83 ohms per square. When the finished thickness of the seed layer is 6 Å, the change in resistance ΔRs is 2.94 ohms per square. When the finished thickness of the seed layer is 3 Å, the change in resistance ΔRs is 2.95 ohms per square.

As shown by dotted line in FIG. 15, in the magnetic sensing element including the conventional seed layer which has the finished thickness being equal to the thickness as deposited, when the thickness of the seed layer becomes equal to or smaller than the critical thickness of 38 Å, the sheet resistance Rs of the magnetic sensing element rapidly increases.

On the other hand, when the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness, the sheet resistance Rs does not rapidly increase even if the finished thickness is smaller than or equal to the critical thickness of 38 Å.

As is evident from FIG. 15, when the finished thickness of the seed layer is 32 Å, the sheet resistance Rs is 18.3 ohms per square. Even when the finished thickness of the seed layer is 12 Å, the sheet resistance Rs is 19.2 ohms per square, which is an increase of only about 1 ohm per square. Even when the finished thickness of the seed layer is 3 Å, the sheet resistance Rs is 20.6 ohms per square.

In the magnetic sensing element including the conventional seed layer with the finished thickness being equal to the thickness as deposited, when the thickness of the seed layer becomes equal to or smaller than 38 Å, the unidirectional exchange bias magnetic field Hex* of the magnetic sensing element rapidly decreases.

On the other hand, when the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness, the unidirectional exchange bias magnetic field Hex* does not rapidly decrease even if the finished thickness is smaller than the critical thickness of 38 Å.

As is evident from FIG. 16, even if the finished thickness of the seed layer is equal to or smaller than the critical thickness of 38 Å or less, if the finished thickness of the seed layer is 12 Å or more, a unidirectional exchange bias magnetic field Hex* of 160 kA/m or more is exhibited. When the finished thickness of the seed layer is 9 Å, the unidirectional exchange bias magnetic field Hex* has the minimum value, which is 158 kA/m (1,972 Oe).

Next, the other magnetic sensing elements were fabricated for testing. In order to fabricate each magnetic sensing element, a seed layer was formed using a $(Ni_{0.8}Fe_{0.2})_{60}Cr_{40}$ alloy at a thickness of 42 Å by sputtering, and the upper surface of the seed layer was etched so that the thickness of the seed layer was smaller than or equal to the critical thickness, i.e., 38 Å. Plasma etching or ion beam etching was used to etch the seed layer. Furthermore, a structure of nonmagnetic metal layer [PtMn (30 Å)]/pinned magnetic layer [CoFe (17 Å)/Ru (8.7 Å)/Co (22 Å)]/nonmagnetic layer [Cu (19 Å)]/free magnetic layer [CoFe (10 Å)/NiFe (35 Å)]/protective layer [Ta (30 Å)] was continuously formed by sputtering on the seed layer. This magnetic sensing element corresponds to the self-pinned magnetic sensing element shown in FIG. 5.

By changing the amount removed from the seed layer, magnetic sensing elements having seed layers with different thicknesses were prepared. The rate of change in resistance ΔRs/Rs, the change in resistance ΔRs, and the sheet resistance Rs were measured.

The results thereof are shown by square (□) in the graphs of FIGS. 13 to 15. FIG. 13 is a graph which shows the measurement results of the rate of change in resistance ΔRs/Rs. FIG. 14 is a graph which shows the measurement results of the change in resistance ΔRs. FIG. 15 is a graph which shows the measurement results of the sheet resistance Rs.

When the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness in accordance with the present invention, as shown in FIG. 13, as the thickness (finished thickness) of the seed layer after the etching step decreases, the rate of change in resistance ΔRs/Rs increases.

As shown in FIG. 13, even if the finished thickness of the seed layer is smaller than or equal to the critical thickness of 38 Å, a rate of change in resistance ΔRs/Rs of 15% or more can be achieved when the finished thickness of the seed layer is 12 Å or more.

The rate of change in resistance ΔRs/Rs increases as the finished thickness of the seed layer decreases because it is believed that the shunt loss due to the flow of the sensing current into the seed layer decreases.

If the finished thickness of the seed layer becomes smaller than 12 Å, the rate of change in resistance ΔRs/Rs rapidly decreases. If the finished thickness of the seed layer is 9 Å or more, a rate of change in resistance ΔRs/Rs of 11.3% or more can be obtained. When the finished thickness of the seed layer is 6 Å, the rate of change in resistance ΔRs/Rs is 3.97%. When the finished thickness of the seed layer is 3 Å, the rate of change in resistance ΔRs/Rs is 3.49%.

As shown in FIG. 14, when the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness, as the thickness (finished thickness) of the seed layer after the etching step decreases, the change in resistance ΔRs increases.

As is evident from FIG. 14, when the finished thickness of the seed layer is 32 Å, the change in resistance ΔRs is 2.78 ohms per square. When the finished thickness of the seed layer is 12 Å, the change in resistance ΔRs is 2.90 ohms per square. If the finished thickness of the seed layer becomes smaller than 12 Å, the change in resistance ΔRs rapidly decreases. If the finished thickness of the seed layer is 9 Å or more, a change in resistance ΔRs of 2.18 ohms per square can be obtained. When the finished thickness of the seed layer is 6 Å, the change in resistance ΔRs is 0.78 ohms per square. When the finished thickness of the seed layer is 3 Å, the change in resistance ΔRs is 0.71 ohms per square.

When the seed layer composed of the $(Ni_{0.8}Fe_{0.2})_{60}Cr_{40}$ alloy is first formed by sputtering at 42 Å, which is larger than the critical thickness of 38 Å, and then the surface of the seed layer is etched so that the thickness is smaller than or equal to the critical thickness, even if the finished thickness is equal to or smaller than the critical thickness of 38 Å, the change in resistance ΔRs does not rapidly increase.

As is evident from FIG. 15, when the finished thickness of the seed layer is 32 Å, the sheet resistance Rs is 17.54 ohms per square. Even when the finished thickness of the seed layer is 12 Å, the sheet resistance Rs is 18.75 ohms per square, which is an increase of only about 1 ohm per square. Even when the finished thickness of the seed layer is 3 Å, the sheet resistance Rs is 20.33 ohms per square.

Next, the crystal structures of laminates including seed layers constituting magnetic sensing elements of the present invention were investigated by X-ray diffraction.

In order to fabricate each magnetic sensing element, a seed layer was formed using a $(Ni_{0.8}Fe_{0.2})_{60}Cr_{40}$ alloy at a thickness of 42 Å by sputtering, and the upper surface of the seed layer was etched so that the thickness of the seed layer was smaller than or equal to the critical thickness, i.e., 38 Å. Plasma etching (inverse sputtering) or ion beam etching was used to etch the seed layer. Furthermore, a structure of antiferromagnetic layer (PtMn)/pinned magnetic layer (CoFe/Ru/CoFe)/nonmagnetic layer (Cu)/free magnetic layer (CoFe/NiFe)/protective layer (Ta) was continuously formed by sputtering on the seed layer.

By changing the amount removed from the seed layer, laminates having seed layers with different thicknesses were prepared. Each laminate was annealed at 290° C. for 3 hours in a vacuum magnetic field of $8\times10^5$ A/m to transform the disordered lattice of the antiferromagnetic layer into the ordered lattice. The resultant magnetic sensing element was analyzed by X-ray diffraction, and the rocking curve of the antiferromagnetic layer (PtMn) and the rocking curve of the seed layer, the pinned magnetic layer (CoFe/Ru/CoFe), the nonmagnetic layer (Cu), and the free magnetic layer (CoFe/NiFe) were obtained.

As comparative examples, magnetic sensing elements were also prepared. In order to fabricate each magnetic sensing element, a seed layer was formed using a $(Ni_{0.8}Fe_{0.2})_{60}Cr_{40}$ alloy at a thickness of 42 Å or 32 Å by sputtering, and without etching the upper surface of the seed layer, a structure of antiferromagnetic layer (PtMn)/pinned magnetic layer (CoFe/Ru/CoFe)/nonmagnetic layer (Cu)/free magnetic layer (CoFe/NiFe)/protective layer (Ta) was continuously formed by sputtering on the seed layer. An annealing treatment was then performed in a vacuum magnetic field. The laminate constituting each magnetic sensing element was analyzed by X-ray diffraction to obtain the rocking curve of the antiferromagnetic layer (PtMn), and the rocking curve of the seed layer, the pinned magnetic layer (CoFe/Ru/CoFe), the nonmagnetic layer (Cu), and the free magnetic layer (CoFe/NiFe).

The results thereof are shown in Table 1 below.

On the other hand, when the seed layer composed of the $(Ni_{0.8}Fe_{0.2})_{60}Cr_{40}$ alloy is formed at 42 Å, which is larger than the critical thickness of 38 Å, and then the thickness is set to be smaller than or equal to the critical thickness by etching the surface of the seed layer, even if the finished thickness of the seed layer is 38 Å or less, the integrated intensity of the rocking curve at an angle of $2\theta$ of the X-ray diffraction peak corresponding to the fcc $\{111\}$ plane of the layer including the seed layer is large, and the half width of the rocking curve is small. The integrated intensity and the half width of the rocking curve are substantially equal to those of the magnetic sensing element of the comparative example in which the seed layer is formed at a thickness of 42 Å.

The reason for this is that the crystal grain size in the in-plane direction of the seed layer is large, and the fcc $\{111\}$ orientation is strong. When the cross section of each of such magnetic sensing elements was checked with a TEM, the crystalline phase including columnar grains extending through the seed layer from the upper surface to the lower surface was observed.

Next, the crystal grain sizes of the seed layers constituting the magnetic sensing elements of the present invention were investigated with a TEM.

In order to fabricate each magnetic sensing element, a seed layer was formed using a $(Ni_{0.8}Fe_{0.2})_{60}Cr_{40}$ alloy at a thickness of 42 Å by sputtering, and the upper surface of the seed layer was etched so that the thickness of the seed layer was smaller than or equal to the critical thickness, i.e., 38 Å. Plasma etching or ion beam etching was used to etch the seed layer. Furthermore, a structure of antiferromagnetic

TABLE 1

X-ray source: Cu-Kβ

| | | Rocking curve of {111} plane of PtMn layer | | | Rocking curve of {111} plane of seed layer, pinned layer, free layer (CoFe), free layer (NiFe), and Cu layer | | |
|---|---|---|---|---|---|---|---|
| Initial thickness of seed layer [A] | Finished thickness of seed layer [A] | 2θ deg | Integrated intensity Cps | Half width deg | 2θ Deg | Integrated intensity Cps | Half width Deg |
| 42 | 35 | 36.21 | 25,312 | 7.1 | 39.35 | 14,614 | 7.3 |
| 42 | 31 | 36.20 | 29,028 | 6.0 | 39.35 | 14,778 | 6.0 |
| 42 | 21 | 36.24 | 19,555 | 6.5 | 39.36 | 13,591 | 6.6 |
| 42 | 11 | 36.27 | 12,668 | 6.7 | 39.38 | 13,278 | 6.2 |
| 42 | 42 | 36.20 | 30,235 | 6.0 | 39.33 | 16,943 | 6.0 |
| 32 | 32 | 36.28 | 763 | No peak | 39.35 | 1,511 | 26 |

Among the magnetic sensing elements of the comparative examples in which the finished thickness is equal to the initial thickness of the seed layer, when the thickness of the seed layer is 32 Å, which is smaller than the critical thickness of 38 Å, the integrated intensity of the rocking curve at an angle of $2\theta$ of the X-ray diffraction peak corresponding to the fcc $\{111\}$ plane of the layer including the seed layer is extremely low, and the half width is extremely large. This indicates that the crystal grain size in the in-plane direction of the seed layer is extremely small and the fcc $\{111\}$ orientation is weak. When the cross section of the magnetic sensing element was checked with a transmission electron micrograph (TEM), the crystalline phase including columnar grains extending through the seed layer from the upper surface to the lower surface was not observed.

layer (PtMn)/pinned magnetic layer (CoFe/Ru/CoFe)/nonmagnetic layer (Cu)/free magnetic layer (CoFe/NiFe)/protective layer (Ta) was continuously formed by sputtering on the seed layer.

By changing the amount removed from the seed layer, magnetic sensing elements having seed layers with different thicknesses were prepared. The cross section of each magnetic sensing element was checked with a TEM. The crystal grain size of the crystal grains generated in the seed layer was visually observed and the average crystal grain size was measured.

As comparative examples, magnetic sensing elements were also prepared. In order to fabricate each magnetic sensing element, a seed layer was formed using a $(Ni_{0.8}Fe_{0.2})_{60}Cr_{40}$ alloy at a thickness of 42 Å or 32 Å by sputtering, and without etching the upper surface of the seed layer, a structure of antiferromagnetic layer (PtMn)/pinned magnetic layer (CoFe/Ru/CoFe)/nonmagnetic layer (Cu)/free magnetic layer (CoFe/NiFe)/protective layer (Ta) was continuously formed by sputtering on the seed layer. The cross sections of the magnetic sensing elements of the comparative examples were also checked with a TEM. The crystal grain size of the crystal grains generated in the seed layer was visually observed and the average crystal grain size was measured.

The results thereof are shown in Table 2 below.

of 38 Å. The average crystal grain sizes of the seed layer before and after etching were compared with each other.

Magnetic sensing elements were fabricated for testing. In order to fabricate each magnetic sensing element, a seed layer was formed by sputtering using a NiFeCr alloy at a thickness that was larger than the critical thickness, and the upper surface of the seed layer was etched so that the thickness of the seed layer was 30 Å. Subsequently, a structure of antiferromagnetic layer (PtMn)/pinned magnetic layer (CoFe/Ru/CoFe)/nonmagnetic layer (Cu)/free mag-

TABLE 2

| | Example 1<br>Crystal grain size ><br>Finished thickness<br>of seed layer<br>Below critical<br>thickness<br>030601<br>Deposited 42 Å →<br>Finished 32 Å | Example 2<br>Crystal grain size ><br>Finished thickness<br>of seed layer<br>Below critical<br>thickness<br>030602<br>Deposited 42 Å →<br>Finished 22 Å | Example 3<br>Crystal grain size ><br>Finished thickness<br>of seed layer<br>Below critical<br>thickness<br>030603<br>Deposited 42 Å →<br>Finished 12 Å | Example 4<br>Crystal grain size ><br>Finished thickness<br>of seed layer<br>Below critical<br>thickness<br>030605<br>Deposited 62 Å →<br>Finished 12 Å | Comparative<br>Example 1<br>Crystal grain size ><br>Finished thickness<br>of seed layer<br>Above critical<br>thickness<br>030607<br>Seed 42<br>Å | Comparative<br>Example 2<br>Crystal grain size <<br>Finished thickness<br>of seed layer<br>Below critical<br>thickness<br>020401<br>Seed 32<br>Å |
|---|---|---|---|---|---|---|
| Average crystal grain size [nm] | 11.5 | 11.3 | 9.5 | 9.6 | 9.8 | 2.0 |
| σ | 3 | 2 | 4 | 3 | 7 | 1 |

Among the magnetic sensing elements of the comparative examples in which the finished thickness is equal to the initial thickness of the seed layer, when the thickness of the seed layer is 32 Å, which is smaller than the critical thickness of 38 Å, the average crystal grain size is 2.0 nm (20 Å), which is smaller than the thickness of the seed layer.

On the other hand, when the seed layer composed of the $(Ni_{0.8}Fe_{0.2})_{60}Cr_{40}$ alloy is formed by sputtering at 42 Å, which is larger than the critical thickness of 38 Å, and then the thickness is set to be smaller than or equal to the critical thickness by etching the surface of the seed layer, even if the finished thickness of the seed layer is 38 Å or less, the average crystal grain size is substantially equal to that of the magnetic sensing element of the comparative example in which the seed layer is formed at 42 Å.

Next, a seed layer was formed by sputtering at a thickness larger than the critical thickness using a NiFeCr alloy, and then the surface of the seed layer was etched so that the thickness was 30 Å, which was below the critical thickness netic layer (CoFe/NiFe)/protective layer (Ta) was continuously formed by sputtering on the seed layer.

For comparison, magnetic sensing elements were also fabricated. In order to fabricate each magnetic sensing element, without etching the seed layer, a structure of antiferromagnetic layer (PtMn)/pinned magnetic layer (CoFe/Ru/CoFe)/nonmagnetic layer (Cu)/free magnetic layer (CoFe/NiFe)/protective layer (Ta) was continuously formed by sputtering on the seed layer. The rates of change in magnetoresistance ΔRs/Rs (ΔR/R) were compared.

The results thereof are shown in Table 3 below.

TABLE 3

Dependence on Cr content

| | NiFeCr layer | | | Critical<br>thickness Å | As<br>deposited<br>Crystal<br>grain size<br>[nm] | Thickness of<br>seed layer as<br>deposited<br>Å | After<br>etching<br>Crystal<br>grain size<br>[nm] | Finished<br>thickness<br>of<br>seed layer<br>Å | Without<br>etching<br>ΔR/R % | Finished<br>thickness<br>of<br>seed layer<br>Å | After<br>etching<br>ΔR/R % | Finished<br>thickness of<br>seed layer<br>Å |
|---|---|---|---|---|---|---|---|---|---|---|---|---|
| | Cr [at %] | Fe [at %] | Ni [at %] | | | | | | | | | |
| Sample 1 | 45.0 | 11.0 | 44.0 | 49 | 11.0 | 60 | 11.5 | 30 | 13.2 | 60 | 14.1 | 30 |
| Sample 2 | 42.9 | 11.4 | 45.7 | 45 | 11.0 | 60 | 11.4 | 30 | 13.0 | 60 | 14.0 | 30 |
| Sample 3 | 39.4 | 12.1 | 48.5 | 38 | 11.2 | 60 | 11.3 | 30 | 13.0 | 60 | 13.9 | 30 |
| Sample 4 | 60.0 | 8.0 | 32.0 | 89 | 12.1 | 100 | 12.1 | 30 | 12.0 | 100 | 14.4 | 30 |
| Sample 5 | 50.0 | 10.0 | 40.0 | 61 | 11.7 | 70 | 11.7 | 30 | 12.9 | 70 | 14.1 | 30 |

Crystal grain size = Average size of crystal grains in the in-plane direction of the seed layer Samples 1 to 5 have different Cr contents. As the Cr content increases, the critical thickness increases.

In any one of Samples 1 to 5, there is substantially no change in the average crystal grain size between before and after etching of the seed layer.

In the magnetic sensing element as the example of the present invention in which the antiferromagnetic layer, the pinned magnetic layer, the nonmagnetic layer, the free magnetic layer, and the protective layer are deposited after the thickness of the seed layer is decreased so as to be 30 Å by etching, a higher rate of change in magnetoresistance ΔRs/Rs (Rs/Rs) is achieved compared with the conventional magnetic sensing element in which the antiferromagnetic layer, the pinned magnetic layer, the nonmagnetic layer, the free magnetic layer, and the protective layer are deposited without etching the seed layer. The reason for this is believed that a decrease in the thickness of the seed layer of the magnetic sensing element as the example of the present invention results in a reduction in shunt loss.

by a method in which after the thickness of the seed layer was decreased so as to be 30 Å by etching, an antiferromagnetic layer, a pinned magnetic layer, a nonmagnetic layer, a free magnetic layer, and a protected layer were deposited on the seed layer.

When the seed layer is deposited on the Ta underlayer, the magnetic sensing element as the example of the present invention has a higher rate of change in magnetoresistance ΔRs/Rs compared with the conventional magnetic sensing element in which the antiferromagnetic layer, etc., are deposited without etching the seed layer. The reason for this is also believed that a decrease in the thickness of the seed

TABLE 4

| | Ta/NiFeCr layer | | | Critical thickness Å | As deposited Crystal grain size [nm] | Thickness of seed layer as deposited Å | Without etching ΔR/R % | Finished thickness of seed layer Å | After etching ΔR/R % | Finished thickness of seed layer Å |
|---|---|---|---|---|---|---|---|---|---|---|
| | Cr [at %] | Fe [at %] | Ni [at %] | | | | | | | |
| Sample 6 | 42.9 | 11.4 | 45.7 | 55 | 11.4 | 60 | 12.6 | 60 | 13.5 | 30 |
| Sample 7 | 39.4 | 12.1 | 48.5 | 35 | 11.3 | 60 | 12.8 | 60 | 13.6 | 30 |
| Sample 8 | 37.1 | 12.6 | 50.3 | | 11.2 | 60 | 12.7 | 60 | 13.5 | 30 |
| Sample 9 | 23.1 | 15.4 | 61.5 | 20 | 10.7 | 60 | 12.7 | 60 | 13.5 | 30 |
| Sample 10 | 13.9 | 17.2 | 68.9 | 17.5 | 10.3 | 60 | 12.0 | 60 | 12.9 | 30 |
| Sample 11 | 0.0 | 20.0 | 80.0 | 15 | 9.8 | 60 | 10.9 | 60 | 11.8 | 30 |

Crystal grain size = Average size of crystal grains in the in-plane direction of the seed layer FIG. 4 shows the comparisons on the rate of change in magnetoresistance ΔRs/Rs (Rs/Rs) between magnetic sensing elements, each being fabricated by a method in which a seed layer was formed on a Ta underlayer by sputtering at a

TABLE 5

| | NiFeCr layer | | | Critical thickness Å | As deposited Crystal grain size [nm] | Thickness of seed layer as deposited Å | After etching Crystal grain size [nm] | Finished thickness of seed layer Å | Without etching ΔR/R % | Finished thickness of seed layer Å | After etching ΔR/R % | Finished thickness of seed layer Å |
|---|---|---|---|---|---|---|---|---|---|---|---|---|
| | Cr [at %] | Fe [at %] | Ni [at %] | | | | | | | | | |
| Sample 12 | 39.4 | 0.0 | 50.6 | 40 | 8.5 | 60 | 8.5 | 30 | 11.1 | 60 | 12.0 | 30 |
| Sample 13 | 39.4 | 6.1 | 54.5 | 42 | 9.5 | 60 | 9.6 | 30 | 12.0 | 60 | 12.9 | 30 |
| Sample 14 | 39.4 | 12.1 | 48.5 | 45 | 10.6 | 60 | 10.6 | 30 | 13.0 | 60 | 13.9 | 30 |
| Sample 15 | 39.4 | 18.2 | 42.4 | 46 | 11.7 | 60 | 11.7 | 30 | 13.3 | 60 | 14.2 | 30 |
| | Cr [at %] | Fe [at %] | Ni [at %] | Critical thickness Å | Crystal grain size [nm] | | Crystal grain size [nm] | Å | ΔR/R % | Å | ΔR/R % | Å |
| Sample 16 | 50.0 | 0.0 | 50.0 | 58 | 9.2 | 70 | 9.2 | 30 | 11.4 | 70 | 12.4 | 30 |
| Sample 17 | 50.0 | 5.0 | 45.0 | 72 | 10 | 80 | 10.1 | 30 | 11.2 | 80 | 13.3 | 30 |
| Sample 18 | 50.0 | 10.0 | 40.0 | 85 | 11 | 100 | 11.0 | 30 | 11.0 | 100 | 14.3 | 30 |
| Sample 19 | 50.0 | 15.0 | 35.0 | 96 | 11.8 | 110 | 11.9 | 30 | 10.5 | 110 | 14.6 | 30 |

Crystal grain size = Average size of crystal grains in the in-plane direction of the seed layer thickness larger than the critical thickness using a NiFeCr alloy, and then without etching the seed layer, an antiferromagnetic layer, a pinned magnetic layer, a nonmagnetic layer, a free magnetic layer, and a protected layer were deposited on the seed layer, and magnetic sensing elements as examples of the present invention, each being fabricated Table 5 shows the comparison results on the average crystal sizes of the seed layers. The seed layers were formed by sputtering at thicknesses larger than the critical thicknesses using NiFeCr alloys with a constant Cr content and varied Fe contents, and the thicknesses were decreased by etching so as to be smaller than the critical thicknesses. The average crystal sizes were measured before and after etching the seed layers.

Comparisons were also performed on the rate of change in magnetoresistance ΔRs/Rs between magnetic sensing elements, each being formed by a method in which the seed layer was formed by sputtering at a thickness larger than the critical thickness, and then, without etching the seed layer, an antiferromagnetic layer, a pinned magnetic layer, a nonmagnetic layer, a free magnetic layer, and a protective layer were deposited, and magnetic sensing elements as the examples of the present invention, each being formed by a method in which after the seed layer was etched, an antiferromagnetic layer, a pinned magnetic layer, a nonmagnetic layer, a free magnetic layer, and a protective layer were deposited.

With the Cr content being constant, as the Fe content increases, the critical thickness increases.

In any one of Samples 12 to 19, the average crystal grain size of the seed layer is not substantially changed before and after etching the seed layer.

In the magnetic sensing element as the example of the present invention in which the antiferromagnetic layer, the pinned magnetic layer, the nonmagnetic layer, the free magnetic layer, and the protective layer are deposited after the thickness of the seed layer is decreased so as to be 30 Å by etching, a higher rate of change in magnetoresistance ΔRs/Rs is achieved compared with the conventional magnetic sensing element in which the antiferromagnetic layer, the pinned magnetic layer, the nonmagnetic layer, the free magnetic layer, and the protective layer are deposited without etching the seed layer. The reason for this is believed that a decrease in the thickness of the seed layer of the magnetic sensing element as the example of the present invention results in a reduction in shunt loss.

Next, seed layers were formed using $(Ni_{0.8}Fe_{0.2})_{100-x}Cr_x$ alloys, wherein x is the Cr content in atomic percent, with different Cr contents. On each seed layer, a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)]/protective layer [Ta (30 Å)] was deposited.

By changing the thickness of the seed layer, the thickness at the critical point below which the unidirectional exchange bias magnetic field Hex*, the change in resistance ΔRs, and the rate of change in resistance ΔRs/Rs rapidly decrease was measured. The thickness at the critical point was shown as the critical thickness of the seed layer in the graph of FIG. 17.

Figure 17:
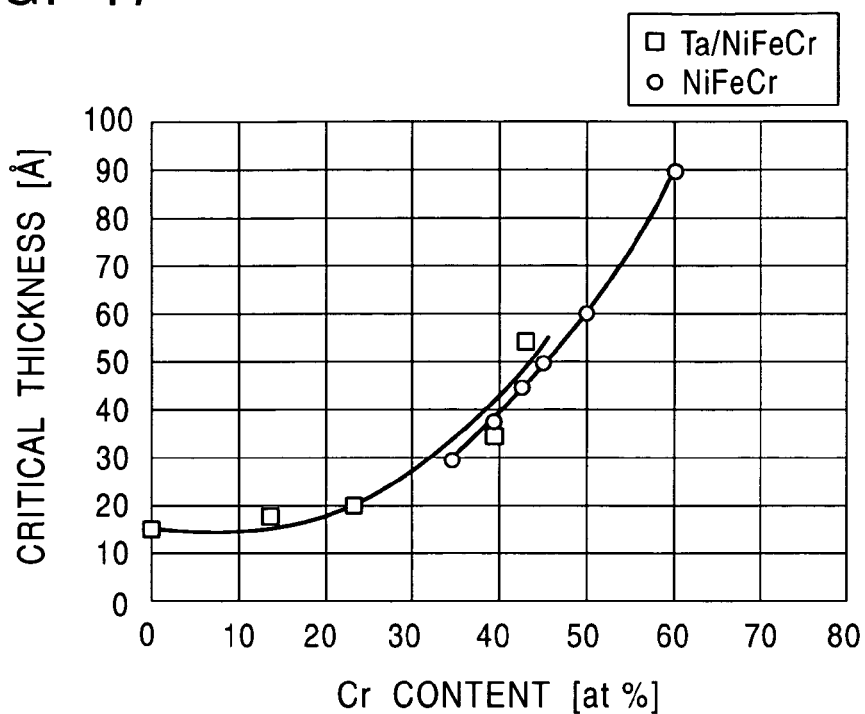
FIG. 17 is a graph which shows the relationship between the Cr content and the critical thickness of seed layers composed of NiFeCr.

As is evident from FIG. 17, as the Cr content in the $(Ni_{0.8}Fe_{0.2})_{100-x}Cr_x$ alloy increases, the critical thickness of the seed layer increases. For example, at a Cr content of 60 atomic percent, the critical thickness is 89 Å; at a Cr content of 50 atomic percent, the critical thickness is 61 Å; at a Cr content of 45 atomic percent, the critical thickness is 49 Å; at a Cr content of 40 atomic percent, the critical thickness is 38 Å; at a Cr content of 39 atomic percent, the critical thickness is 35 Å; and at a Cr content of 35 atomic percent, the critical thickness is 30 atomic percent.

FIG. 17 also shows the critical thickness of the seed layers, each seed layer being formed on an underlayer composed of Ta (32 Å) using a $(Ni_{0.8}Fe_{0.2})_{100-x}Cr_x$ alloy with a different Cr content, a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)/protective layer [Ta (30 Å)] being deposited on the seed layer.

When a seed layer is formed on an underlayer composed of Ta using a $(Ni_{0.8}Fe_{0.2})_{100-x}Cr_x$ alloy, wherein x is the Cr content in atomic percent, it is possible to form a seed layer using a NiFeCr alloy with a lower Cr content compared with the case in which an underlayer is not used, and thereby the critical thickness can be decreased. For example, when the Cr content in the $(Ni_{0.8}Fe_{0.2})_{100-x}Cr_x$ alloy is 23 atomic percent, the critical thickness is 20 Å. When the Cr content is 14 atomic percent, the critical thickness is 17.5 Å.

Figure 18:
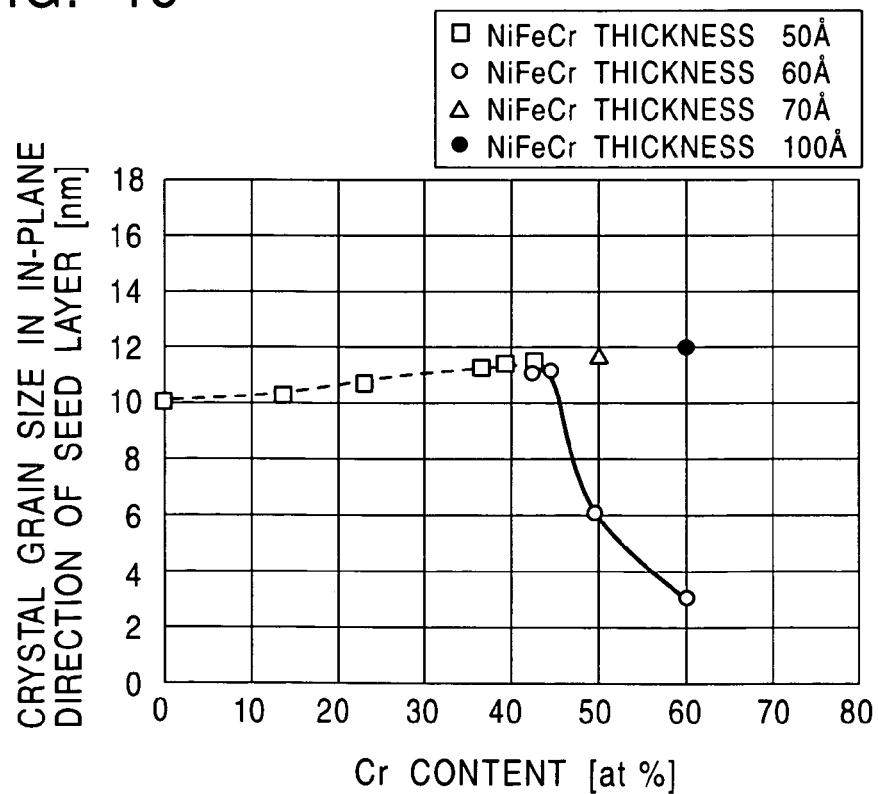
FIG. 18 is a graph which shows the relationship between the Cr content and the average crystal grain size of conventional seed layers composed of NiFeCr.

FIG. 18 is a graph which shows the relationships among the Cr content in the seed layer composed of a $(Ni_{0.8}Fe_{0.2})_{100-x}Cr_x$ alloy, wherein x is the Cr content in atomic percent, the thickness of the seed layer as deposited, and the average crystal grain size of the crystalline phase generated in the seed layer.

As is evident from FIG. 18, when the seed layer composed of a NiFeCr alloy is deposited at a thickness larger than the critical thickness, if the Cr content is increased, the size of crystal grains formed in the NiFeCr alloy can be increased.

If the Cr content in the NiFeCr alloy is 45 atomic percent or less, the critical thickness of the seed layer is 49 Å or less. Consequently, if the seed layer is formed at a thickness of 50 Å or more, the average gain size of the crystalline phase generated in the seed layer increases in proportion to the Cr content. However, when the Cr content is set at 50 atomic percent (critical thickness: 61 Å) or 60 atomic percent (critical thickness: 89 Å), the average crystal grain size of the crystalline phase generated in the seed layer is rapidly decreased unless the seed layer is formed at a thickness larger than the critical thickness, for example, at 70 Å or 100 Å.

Figure 19:
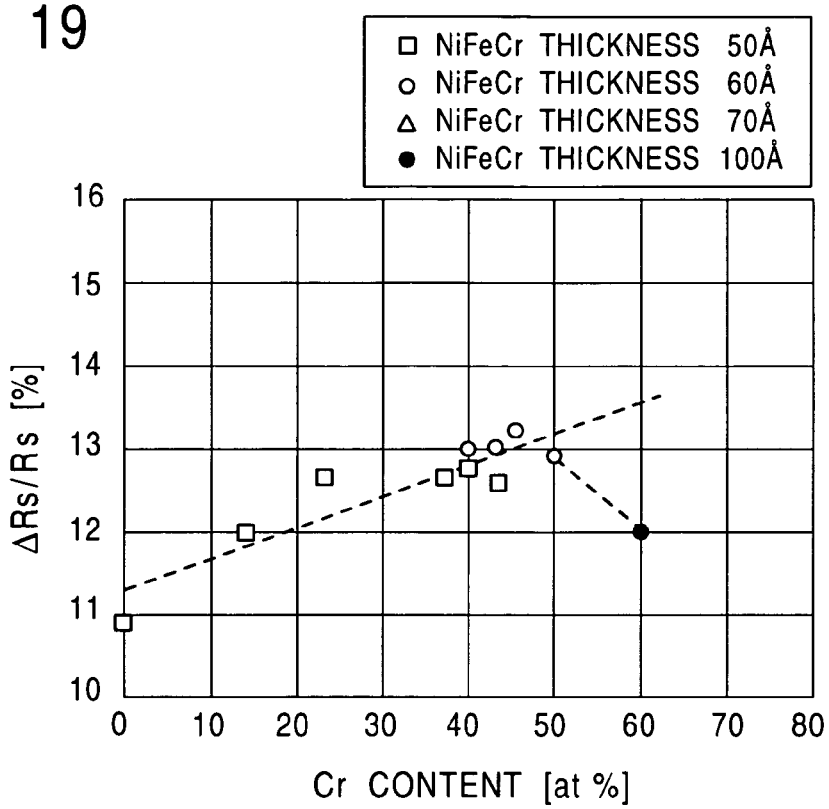
FIG. 19 is a graph which shows the relationship between the Cr content and the rate of change in magnetoresistance of magnetic sensing elements including conventional seed layers composed of NiFeCr.

FIG. 19 is a graph which shows the relationships among the Cr content in the seed layer composed of a $(Ni_{0.8}Fe_{0.2})_{100-x}Cr_x$ alloy, wherein x is the Cr content in atomic percent, the thickness of the seed layer as deposited, and the rate of change in magnetoresistance ΔRs/Rs of a magnetic sensing element fabricated by depositing a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)]/protective layer [Ta (30 Å)] on the seed layer.

As is evident from FIG. 19, at a Cr content of 50 atomic percent (critical thickness: 61 Å) or 60 atomic percent (critical thickness: 89 Å), if the seed layer is deposited at 70 Å or 100 Å, which is larger than the critical thickness, the rate of change in magnetoresistance ΔRs/Rs does not increase in proportion to the Cr content of the seed layer. The reason for this is that an increase in the thickness of the seed layer results in an increase in the shunt loss of the sensing current.

Figure 20:
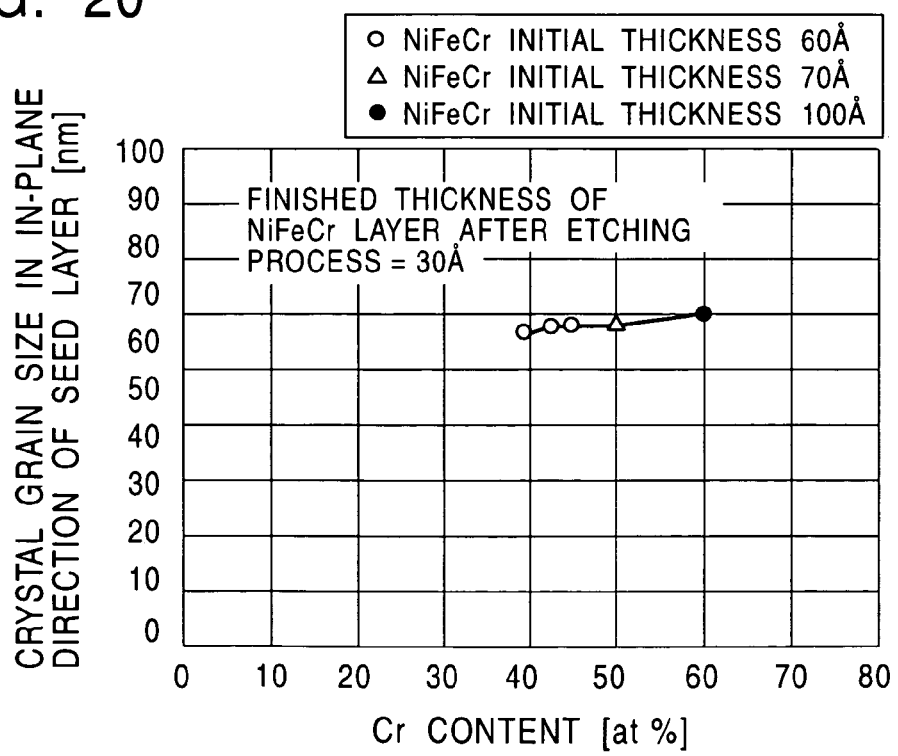
FIG. 20 is a graph which shows the relationship between the Cr content and the average crystal grain size of seed layers composed of NiFeCr in the present invention.

FIG. 20 is a graph which shows the relationships among the Cr content in the seed layer composed of a $(Ni_{0.8}Fe_{0.2})_{100-x}Cr_x$ alloy, wherein x is the Cr content in atomic percent, the thickness of the seed layer as deposited, and the average crystal grain size of the crystalline phase generated in the seed layer when the seed layer is deposited at a thickness larger than the critical thickness and then the thickness of the seed layer is decreased so as to be 30 Å by plasma etching (inverse sputtering) or ion beam etching.

As is evident from FIG. 20, when the seed layer is deposited at a thickness (NiFeCr initial thickness) that is larger than the critical thickness and then the thickness of the seed layer is decreased so as to be 30 Å, which is below the critical thickness, it is possible to increase the crystal grain size of the crystal grains formed in the seed layer.

Figure 21:
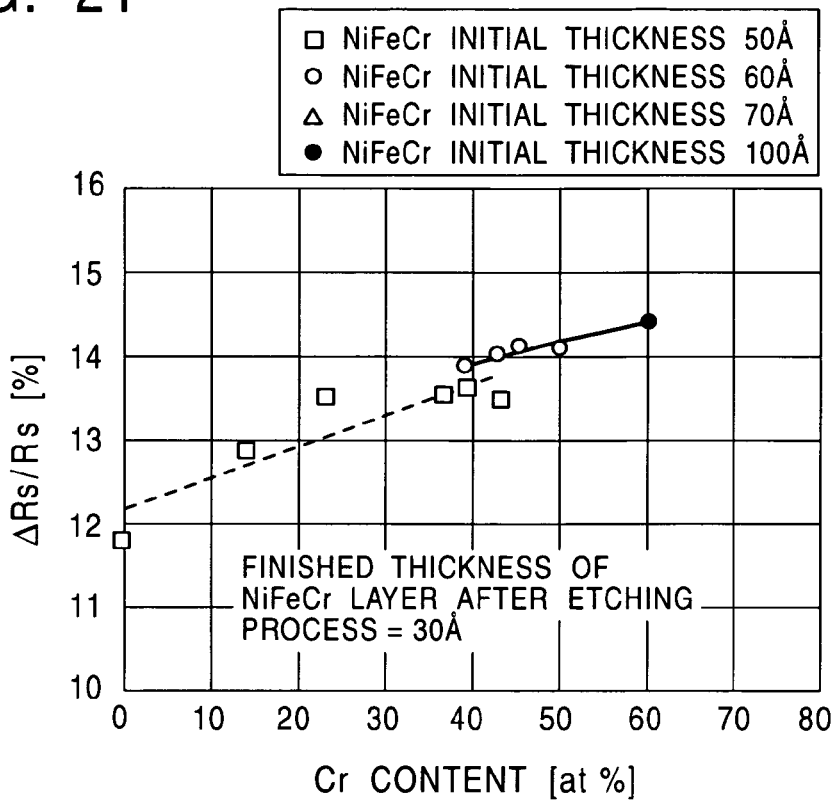
FIG. 21 is a graph which shows the relationship between the Cr content and the rate of change in magnetoresistance of seed layers composed of NiFeCr in the present invention.

FIG. 21 is a graph a graph which shows the relationships among the Cr content in the seed layer composed of a $(Ni_{0.8}Fe_{0.2})_{100-x}Cr_x$ alloy, wherein x is the Cr content in atomic percent, the thickness of the seed layer as deposited (NiFeCr initial thickness), and the rate of change in magnetoresistance ΔRs/Rs of a magnetic sensing element fabricated by depositing a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)]/protective layer [Ta (30 Å)] on the seed layer after the seed layer deposited at a thickness larger than the critical thickness is etched by plasma etching (inverse sputtering) or ion beam etching so that the thickness is 30 Å which is below the critical thickness.

As is evident from FIG. 21, when the seed layer is deposited at a thickness (NiFeCr initial thickness) that is larger than the critical thickness and then the seed layer is etched so that the thickness is below the critical thickness, it is possible to increase the rate of change in magnetoresistance ΔRs/Rs of the magnetic sensing element in proportion to the Cr content.

Next, a seed layer was formed using a $Ni_{61-x}Fe_xCr_{39}$ alloy, wherein x is the Fe content in atomic percent, and then a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)]/protective layer [Ta (30 Å)] was deposited on the seed layer.

By changing the thickness of the seed layer, the thickness at the critical point below which the unidirectional exchange bias magnetic field Hex*, the change in resistance ΔRs, and the rate of change in magnetoresistance ΔRs/Rs (ΔR/R) rapidly decrease was measured. The thickness at the critical point was shown as the critical thickness of the seed layer in the graph of FIG. 22.

Figure 22:
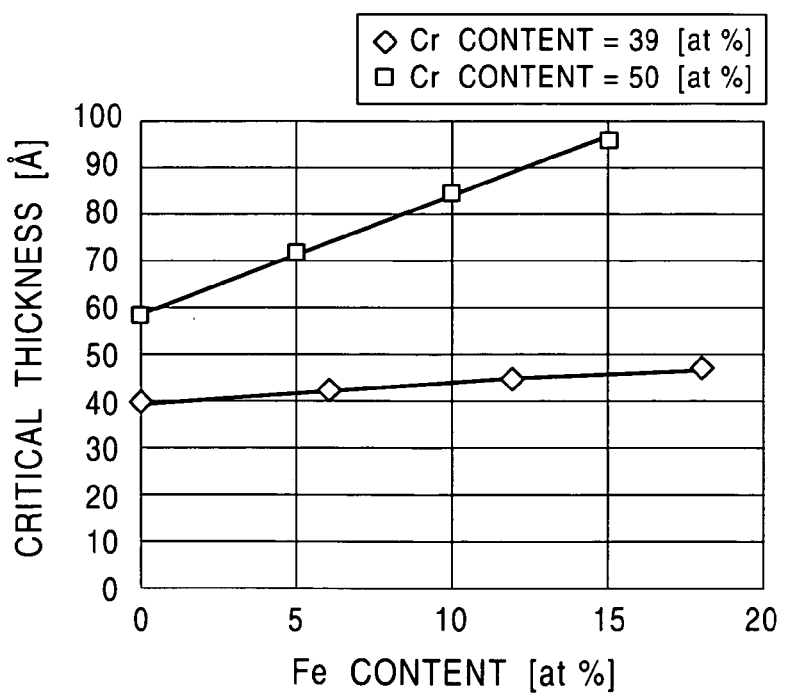
FIG. 22 is a graph which shows the relationship between the Fe content and the critical thickness of seed layers composed of NiFeCr.

As is evident from FIG. 22, as the Fe content in the $Ni_{61-x}Fe_xCr_{39}$ alloy, wherein x is the Fe content in atomic percent, increases, the critical thickness of the seed layer increases. For example, at an Fe content of 18 atomic percent, the critical thickness is 46 Å; and at an Fe content of 6 atomic percent, the critical thickness if 42 Å.

Additionally, the critical thickness of the $Ni_{61}Cr_{39}$ alloy which does not contain Fe is 40 Å.

FIG. 22 also shows the critical thickness of the seed layer formed using a $Ni_{50-x}Fe_xCr_{50}$, wherein x is the Fe content in atomic percent, a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)/protective layer [Ta (30 Å)] being deposited on the seed layer.

For example, at an Fe content of 15 atomic percent, the critical thickness is 96 Å; and at an Fe content of 5 atomic percent, the critical thickness is 72 Å.

Additionally, the critical thickness of the $Ni_{50}Cr_{50}$ alloy which does not contain Fe is 58 Å. In the NiFeCr alloy, as the Cr content increases, the rate of increase in the critical thickness (proportionality factor) with the Fe content increases.

In the NiCr alloy which does not contain Fe, as the Cr content increases, the critical thickness also increases.

Figure 23:
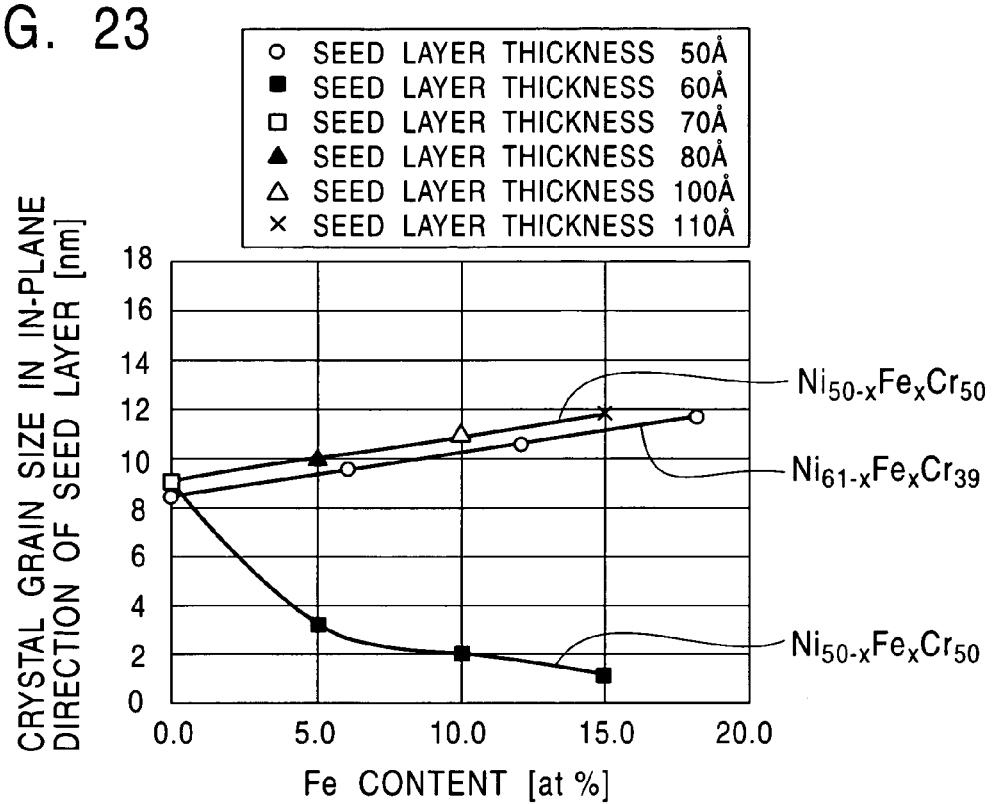
FIG. 23 is a graph which shows the relationship between the Fe content and the average crystal grain size of conventional seed layers composed of NiFeCr.

FIG. 23 is a graph which shows the relationships among the Fe content of the NiFeCr alloy constituting the seed layer, the thickness of the seed layer as deposited (seed layer thickness), and the average crystal grain size of the crystalline phase generated in the seed layer, when the seed layer is formed using a $Ni_{61-x}Fe_xCr_{39}$ alloy or $Ni_{50-x}Fe_xCr_{50}$ alloy, wherein x is the Fe content in atomic percent.

As is evident from FIG. 23, in the seed layer composed of the NiFeCr alloy, if the seed layer is deposited at a thickness larger than the critical thickness, the crystal grain size of the crystal grains formed in the seed layer can be increased by increasing the Fe content.

When the seed layer is formed at a thickness of 60 Å using a $Ni_{61-x}Fe_xCr_{39}$ alloy, in the range shown in FIG. 23, since the thickness of the seed layer is larger than the critical thickness, the average crystal grain size of the seed layer increases in proportion to the Fe content.

On the other hand, when the seed layer is formed using a $Ni_{50-x}Fe_xCr_{50}$ alloy, wherein x is the Fe content in atomic percent, the average crystal grain size of the seed layer rapidly decreases unless the seed layer is deposited at 80 Å or 100 Å, which is larger than the critical thickness.

Figure 24:
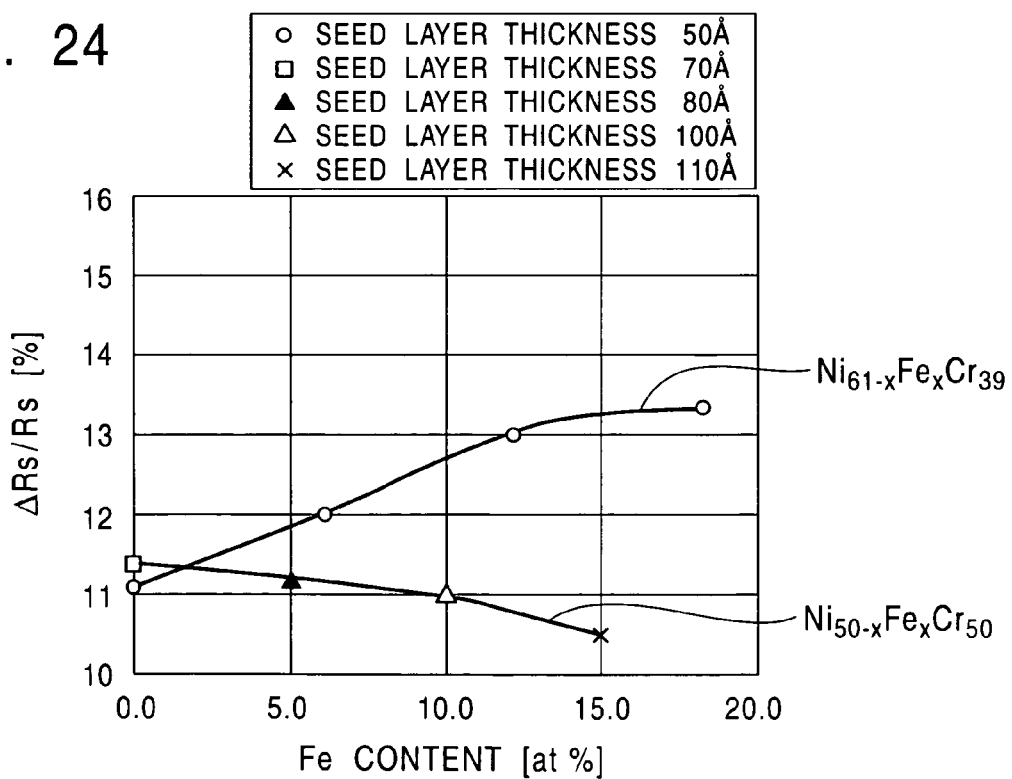
FIG. 24 is a graph which shows the relationship between the Fe content and the rate of change in magnetoresistance of magnetic sensing elements including conventional seed layers composed of NiFeCr.

FIG. 24 is a graph which shows the relationships among the Fe content in the NiFeCr alloy constituting the seed layer, the thickness of the seed layer as deposited (seed layer thickness), and the rate of change in magnetoresistance ΔRs/Rs (ΔR/R) when the seed layer is formed using a $Ni_{61-x}Fe_xCr_{39}$ alloy or $Ni_{50-x}Fe_xCr_{50}$ alloy, wherein x is the Fe content in atomic percent, and a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)]/protective layer [Ta (30 Å)] is deposited on the seed layer to fabricate a magnetic sensing element.

As is evident from FIG. 24, when the seed layer is deposited at a thickness of 50 Å using a $Ni_{61-x}Fe_xCr_{39}$ alloy, the rate of change in magnetoresistance ΔRs/Rs (ΔR/R) of the magnetic sensing element increases in proportion to the Fe content.

However, in the seed layer composed of a $Ni_{50-x}Fe_xCr_{50}$ alloy, when the Fe content is set at 5 atomic percent (critical thickness: 72 Å), 10 atomic percent (critical thickness: 85 Å), or 15 atomic percent (critical thickness: 96 Å), if the seed layer is deposited at 80 Å, 100 Å, or 110 Å, which is larger than the critical thickness, the rate of change in magnetoresistance ΔRs/Rs (ΔR/R) of the magnetic sensing element does not increase in proportion to the Fe content. The reason for this is that an increase in the thickness of the seed layer results in an increase in the shunt loss of the sensing current.

Figure 25:
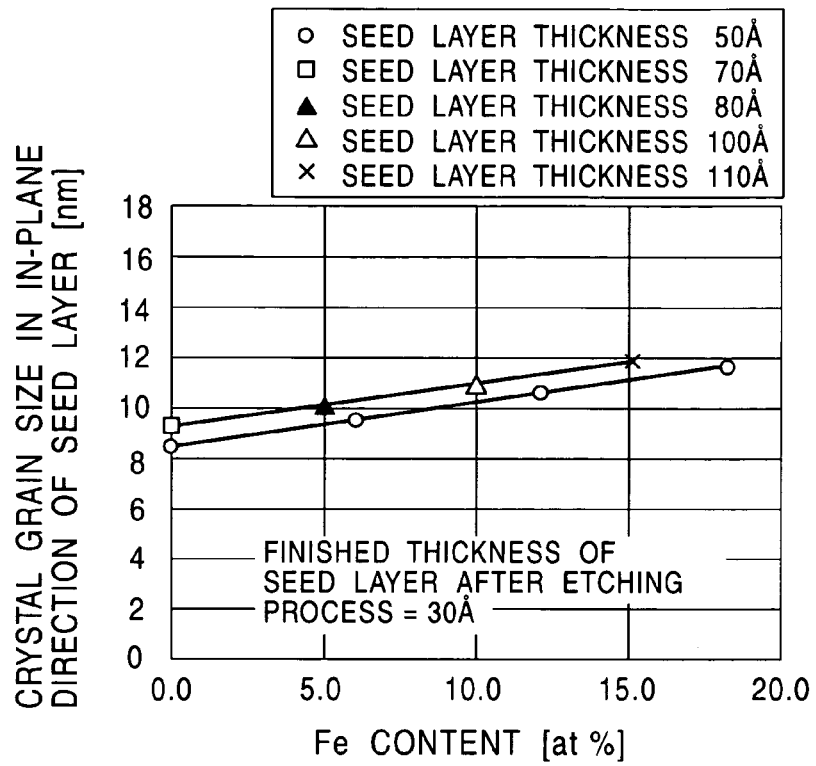
FIG. 25 is a graph which shows the relationship between the Fe content and the average crystal grain size of seed layers composed of NiFeCr in the present invention.

FIG. 25 is a graph which shows the relationships among the Fe content in the NiFeCr alloy, the thickness of the seed layer as deposited (seed layer thickness), and the average crystal grain size of the crystalline phase generated in the seed layer when the seed layer is formed using a $Ni_{61-x}Fe_xCr_{39}$ alloy or $Ni_{50-x}Fe_xCr_{50}$ alloy, wherein x is the Fe content in atomic percent, and then the thickness of the seed layer is decreased so as to be 30 Å, which is below the critical thickness, by plasma etching (inverse sputtering) or ion beam etching.

As is evident from FIG. 25, in the seed layer composed of the NiFeCr alloy, when the seed layer is deposited at a thickness larger than the critical thickness and then the thickness is decreased so as to be below the critical thickness, the size of the crystal grains formed in the seed layer can be increased in proportion to the Fe content.

When the composition ratio of the NiFeCr alloy is the same, the average crystal grain size of the seed layer as deposited is substantially the same as that of the seed layer subjected to the etching step.

Figure 26:
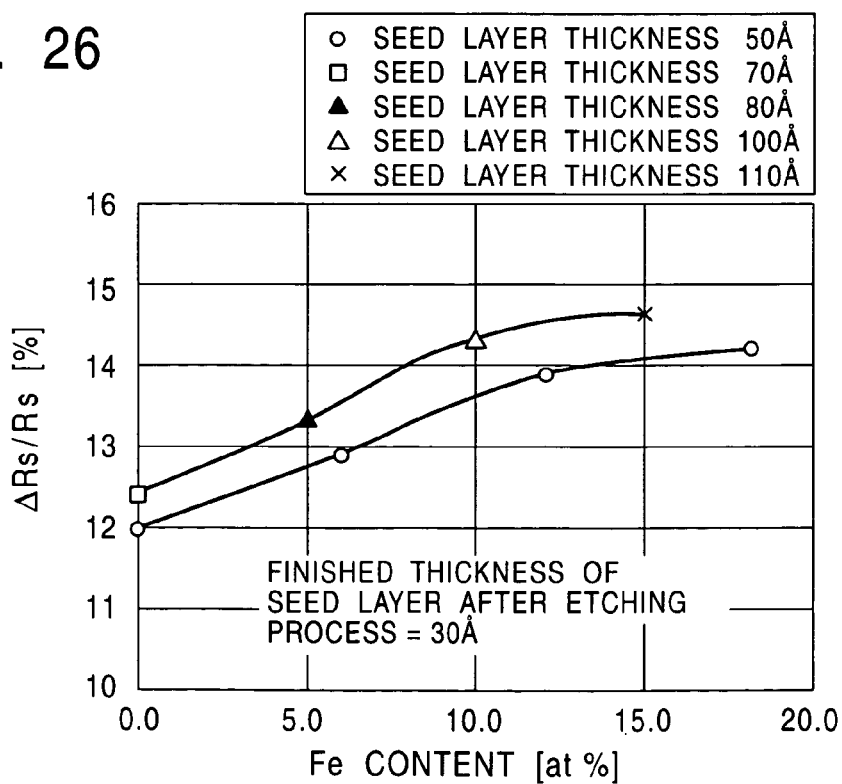
FIG. 26 is a graph which shows the relationship between the Fe content and the rate of change in magnetoresistance of magnetic sensing elements including seed layers composed of NiFeCr in the present invention.
Figure 27:
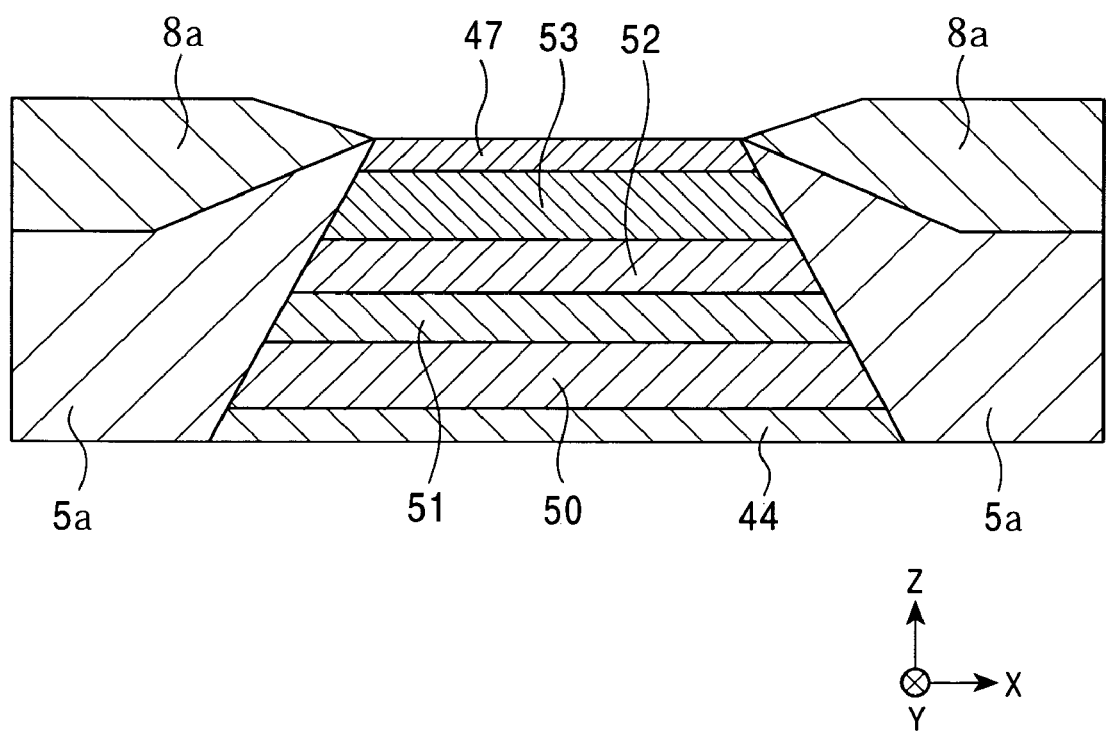
FIG. 27 is a sectional view of a conventional magnetic sensing element, viewed from a surface facing a recording medium.
Figure 28:
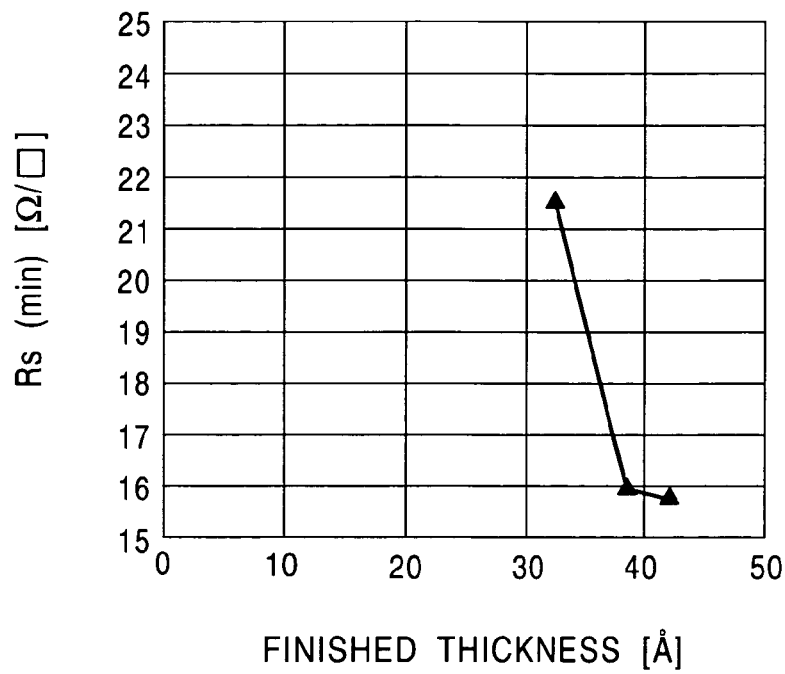
FIG. 28 is a graph which shows the relationship between the thickness of finished seed layers and the sheet resistance of conventional magnetic sensing elements.
Figure 29:
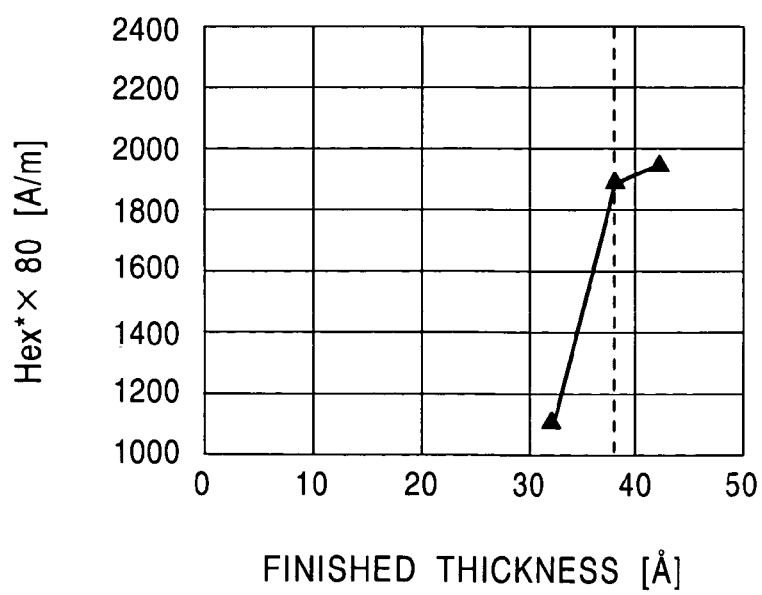
FIG. 29 is a graph which shows the relationship between the thickness of finished seed layers and the unidirectional exchange bias magnetic field (Hex*) of conventional magnetic sensing elements.
Figure 30:
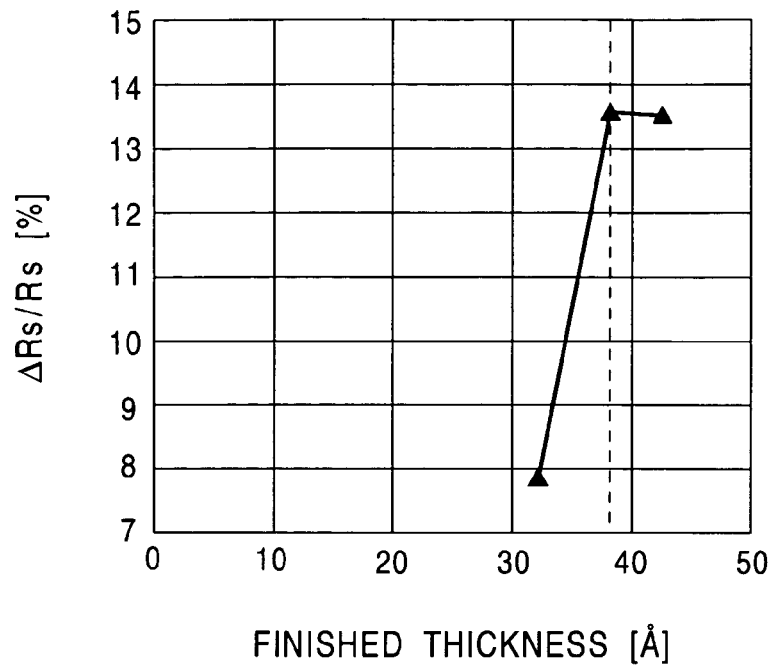
FIG. 30 is a graph which shows the relationship between the thickness of finished seed layers and the rate of change in magnetoresistance of conventional magnetic sensing elements.
Figure 31:
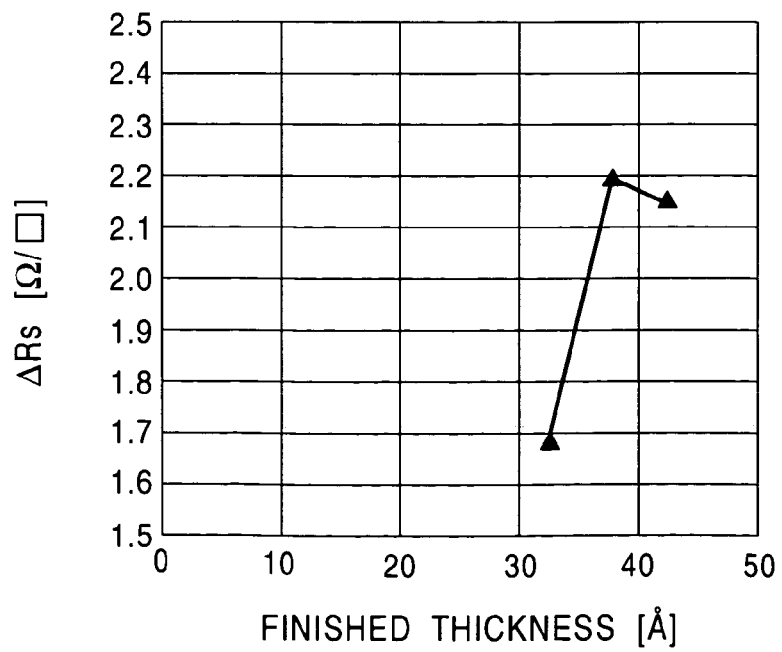
FIG. 31 is a graph which shows the relationship between the thickness of finished seed layers and the change in sheet resistance of conventional magnetic sensing elements.

FIG. 26 is a graph which shows the relationships among the Fe content in the NiFeCr alloy constituting the seed layer, the thickness of the seed layer as deposited (seed layer thickness), and the rate of change in magnetoresistance ΔRs/Rs (ΔR/R) of the magnetic sensing element when the seed layer is formed using a $Ni_{61-x}Fe_xCr_{39}$ alloy or $Ni_{50-x}Fe_xCr_{50}$ alloy, wherein x is the Fe content in atomic percent; the thickness of the seed layer is decreased so as to be 30 Å, which is below the critical thickness, by plasma etching (inverse sputtering) or ion beam etching; and a structure of antiferromagnetic layer [PtMn (120 Å)]/pinned magnetic layer [CoFe (16 Å)/Ru (8.7 Å)/CoFe (22 Å)]/nonmagnetic layer [Cu (21 Å)]/free magnetic layer [CoFe (10 Å)/NiFe (18 Å)]/back layer [Cu (10 Å)]/protective layer [Ta (30 Å)] is deposited on the seed layer to fabricate a magnetic sensing element.

As is evident from FIG. 26, when the seed layer is deposited at a thickness larger than the critical thickness and then the thickness is decreased so as to be below the critical thickness by etching, it is possible to increase the rate of change in magnetoresistance ΔRs/Rs (ΔR/R) of the magnetic sensing element in proportion to the Fe content.

When the composition ratio of the NiFeCr alloy is the same, the rate of change in magnetoresistance ΔRs/Rs (ΔR/R) of the magnetic sensing element formed on the seed layer with the thickness of 30 Å, which is obtained by etching after the deposition, is larger than the rate of change in magnetoresistance ΔRs/Rs (ΔR/R) of the magnetic sensing element formed on the seed layer with the thickness as deposited.

The reason for this is that a decrease in the thickness of the seed layer results in a reduction in shunt loss of the sensing current.

When a magnetic sensing element is formed on the seed layer deposited at a thickness of 50 Å using a $Ni_{61}Cr_{39}$ alloy which does not contain Fe, the rate of change in magnetoresistance ΔRs/Rs (ΔR/R) is 11.1%. When a magnetic sensing element is formed on the seed layer deposited at a thickness of 50 Å using a $Ni_{61}Cr_{39}$ alloy, the thickness of the seed layer being decreased so as to be 30 Å by etching, the rate of change in magnetoresistance ΔRs/Rs (ΔR/R) is 12.0%.

When a magnetic sensing element is formed on the seed layer deposited at a thickness of 70 Å using a $Ni_{50}Cr_{50}$ alloy which does not contain Fe, the rate of change in magnetoresistance ΔRs/Rs (ΔR/R) is 11.4%. When a magnetic sensing element is formed on the seed layer deposited at a thickness of 70 Å using a $Ni_{50}Cr_{50}$ alloy, the thickness of the seed layer being decreased so as to be 30 Å by etching, the rate of change in magnetoresistance ΔRs/Rs (ΔR/R) is 12.4%.

The fabrication of the magnetic sensing element including a seed layer composed of a NiCr alloy or NiFeCr alloy with a Cr content of 40 atomic percent or more with a thickness that is larger than 0 Å and smaller than or equal to 38 Å as described above has been achieved for the first time by the present invention.

The fabrication of the magnetic sensing element including a seed layer composed of a NiCr alloy or NiFeCr alloy with a Cr content of 35 atomic percent or more with a thickness that is larger than 0 Å and smaller than or equal to 30 Å has also been achieved for the first time by the present invention.

However, if the thickness of the seed layer is excessively large, it takes a long time to form the seed layer, resulting in adverse effects, such as an increase in the thickness of the magnetic sensing element and an increase in shunt loss. Consequently, in the present invention, the thickness of the seed layer is preferably 60 Å or less, and more preferably 50 Å or less.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. For example, the present invention is also applicable to a current-perpendicular-to-the-plane (CPP) type GMR magnetic sensing element in which electrodes are provided on the top and bottom of a laminate constituting the magnetic sensing element and a sensing current flows perpendicular to the planes of the individual layers constituting the laminate.

What is claimed is:

1. An exchange-coupled film comprising a seed layer, an antiferromagnetic layer, and a ferromagnetic layer disposed in that order from the bottom, a magnetization of the ferromagnetic layer being directed in a predetermined direction by an exchange coupling magnetic field generated at an interface between the antiferromagnetic layer and the ferromagnetic layer;
   wherein the seed layer is a metal layer etched from a critical thickness or larger to have a thickness that is smaller than or equal to the critical thickness, wherein the seed layer comprises an etched surface facing the antiferromagnetic layer, and wherein the seed layer includes crystal grains, each crystal grain having a first end face flush with the etched surface and a second end face flush with an opposing lower surface of the seed layer; and
   wherein a crystalline phase of the seed layer has a face-centered cubic structure and an equivalent crystal plane represented as {111} plane is oriented parallel to the interface.

2. The exchange-coupled film according to claim 1, wherein the seed layer comprises a NiCr alloy or a NiFeCr alloy.

3. The exchange-coupled film according to claim 2, wherein the Cr content in the NiCr alloy or the NiFeCr alloy is 40 to 60 atomic percent, and a thickness of the seed layer is larger than 0 Å and smaller than or equal to 38 Å.

4. The exchange-coupled film according to claim 3, wherein the thickness of the seed layer is 6 Å or more.

5. The exchange-coupled film according to claim 4, wherein the thickness of the seed layer is 12 Å or more.

6. A magnetic sensing element comprising the exchange-coupled film according to claim 1, the ferromagnetic layer being a pinned magnetic layer, and further comprising a nonmagnetic layer and a free magnetic layer disposed on the exchange-coupled film in that order from the bottom, a magnetization of the free magnetic layer being aligned in a direction substantially perpendicular to a magnetization direction of the pinned magnetic layer.

7. A magnetic sensing element comprising the exchange-coupled film according to claim 1, the ferromagnetic layer being a free magnetic layer and the antiferromagnetic layer being an antiferromagnetic exchange bias layer, and further comprising a nonmagnetic layer, a pinned magnetic layer, and an antiferromagnetic layer disposed on the exchange-coupled film in that order from the bottom, a magnetization of the free magnetic layer being aligned in a direction substantially perpendicular to a magnetization direction of the pinned magnetic layer.

8. A magnetic sensing element comprising a free magnetic layer, an upper nonmagnetic layer disposed on the free magnetic layer, a lower nonmagnetic layer disposed under the free magnetic layer, an upper pinned magnetic layer disposed on the upper nonmagnetic layer, an upper antiferromagnetic layer disposed on the upper pinned magnetic layer, and the exchange-coupled film according to claim 1 disposed under the lower nonmagnetic layer, the ferromagnetic layer being a lower pinned magnetic layer and the antiferromagnetic layer being a lower antiferromagnetic layer, a magnetization of the free magnetic layer being aligned in a direction substantially perpendicular to a magnetization direction of the upper pinned magnetic layer and the lower pinned magnetic layer.

9. A magnetic sensing element comprising the exchange-coupled film of claim 1, the antiferromagnetic layer being an antiferromagnetic exchange bias layer and the ferromagnetic layer being a magnetoresistive layer, and further comprising a nonmagnetic layer and a soft magnetic layer disposed on the exchange-coupled film.

10. An exchange-coupled film comprising a seed layer, an antiferromagnetic layer, and a ferromagnetic layer disposed in that order from the bottom, a magnetization of the ferromagnetic layer being directed in a predetermined direction by an exchange coupling magnetic field generated at an interface between the antiferromagnetic layer and the ferromagnetic layer;

wherein the seed layer is a metal layer etched from a critical thickness or larger to have a thickness that is smaller than or equal to the critical thickness, wherein the seed layer comprises an etched surface facing the antiferromagnetic layer, and wherein the seed layer includes crystal grains, each crystal grain having a first end face flush with the etched surface and a second end face flush with an opposing lower surface of the seed layer;

wherein the seed layer comprises a NiCr alloy or a NiFeCr alloy; and wherein the Cr content in the NiCr alloy or the NiFeCr alloy is 35 to 60 atomic percent, and a thickness of the seed layer is larger than 0 Å and smaller than or equal to 30 Å.

* * * * *